(12) United States Patent
Choi et al.

(10) Patent No.: US 10,734,547 B2
(45) Date of Patent: Aug. 4, 2020

(54) SEMICONDUCTOR DEVICE AND SEMICONDUCTOR DEVICE PACKAGE COMPRISING SAME

(71) Applicant: LG INNOTEK CO., LTD., Seoul (KR)

(72) Inventors: Rak Jun Choi, Seoul (KR); Byeoung Jo Kim, Seoul (KR); Hyun Jee Oh, Seoul (KR); Jung Yeop Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/312,937

(22) PCT Filed: Jun. 23, 2017

(86) PCT No.: PCT/KR2017/006661
§ 371 (c)(1),
(2) Date: Dec. 21, 2018

(87) PCT Pub. No.: WO2017/222341
PCT Pub. Date: Dec. 28, 2017

(65) Prior Publication Data
US 2019/0326473 A1  Oct. 24, 2019

(30) Foreign Application Priority Data

Jun. 24, 2016 (KR) .................. 10-2016-0079489
Aug. 31, 2016 (KR) .................. 10-2016-0112146

(51) Int. Cl.
*H01L 33/18* (2010.01)
*H01L 33/22* (2010.01)
(Continued)

(52) U.S. Cl.
CPC .............. *H01L 33/18* (2013.01); *H01L 33/22* (2013.01); *H01L 33/30* (2013.01); *H01L 33/36* (2013.01)

(58) Field of Classification Search
None
See application file for complete search history.

(56) References Cited

U.S. PATENT DOCUMENTS

2009/0283787 A1* 11/2009 Donofrio ............. H01L 33/405
257/98
2010/0284433 A1* 11/2010 Hata ..................... B82Y 20/00
372/45.011

(Continued)

FOREIGN PATENT DOCUMENTS

KR   10-2011-0023166    3/2011
KR   10-2012-0005385    1/2012
(Continued)

OTHER PUBLICATIONS

International Search Report (with English Translation) and Written Opinion dated Oct. 30, 2017 issued in Application No. PCT/KR2017/006661.

*Primary Examiner* — Bo B Jang
(74) *Attorney, Agent, or Firm* — KED & Associates LLP

(57) ABSTRACT

An embodiment relates to a semiconductor device, a semiconductor device package, and a method for producing a semiconductor device, the semiconductor device comprising a light emitting structure including a first conductivity type semiconductor layer, a second conductivity type semiconductor layer, an active layer disposed between the first conductivity type semiconductor layer and the second conductivity type semiconductor layer, and an intermediate layer disposed between the first conductivity type semiconductor layer and the active layer, or disposed inside the first conductivity type semiconductor layer, wherein the first conductivity type semiconductor layer, the intermediate layer, the active layer, and the second conductivity type semiconductor layer include aluminum, and the intermediate layer includes a first intermediate layer having a lower (Continued)

aluminum composition than that of the first conductivity type semiconductor layer.

20 Claims, 22 Drawing Sheets

(51) Int. Cl.
*H01L 33/30* (2010.01)
*H01L 33/36* (2010.01)

(56) References Cited

U.S. PATENT DOCUMENTS

| | | |
|---|---|---|
| 2012/0007101 A1 | 1/2012 | Yang et al. |
| 2012/0007118 A1* | 1/2012 | Choi .................. H01L 33/382 257/98 |
| 2012/0145992 A1 | 6/2012 | Yoo et al. |
| 2013/0082237 A1 | 4/2013 | Northrup et al. |
| 2013/0256630 A1 | 10/2013 | Han et al. |
| 2017/0110852 A1 | 4/2017 | Mino et al. |

FOREIGN PATENT DOCUMENTS

| | | |
|---|---|---|
| KR | 10-2015-0048337 | 5/2015 |
| WO | WO 2015/151471 | 10/2015 |

\* cited by examiner

SEMICONDUCTOR DEVICE AND SEMICONDUCTOR DEVICE PACKAGE COMPRISING SAME

CROSS-REFERENCE TO RELATED PATENT APPLICATIONS

This application is a U.S. National Stage Application under 35 U.S.C. § 371 of PCT Application No. PCT/KR2017/006661, filed Jun. 23, 2017, which claims priority to Korean Patent Application No. 10-2016-0079489, filed Jun. 24, 2016, and Korean Patent Application No. 10-2016-0122146, filed Aug. 31, 2016, whose entire disclosures are hereby incorporated by reference.

TECHNICAL FIELD

Embodiments relate to a semiconductor device and a semiconductor device package including the same.

BACKGROUND ART

Semiconductor devices including compounds such as GaN, AlGaN, and the like have many advantages such as wide and easily adjustable bandgap energy and the like, and can be variously used as light emitting devices, light receiving devices, various diodes, and the like.

Particularly, a light emitting device such as a light emitting diode or a laser diode using a Group III-V or II-VI compound semiconductor material may realize various colors, such as red light, green light, blue light, an ultraviolet light, and the like, resulting from development of a thin film growth technique and a device material, realize white light with high efficiency using a phosphor or by combining colors, and has advantages of low power consumption, a semi-permanent lifetime, a fast response time, safety, and environment friendliness when compared to conventional light sources such as fluorescent lamps and incandescent lamps.

In addition, when a light receiving device such as a photodetector or a solar cell is manufactured using a Group III-V or II-VI compound semiconductor material, due to development of an element material, the light receiving element absorbs light of various wavelength regions to generate a photoelectric current so that light in various wavelength regions from gamma rays to a radio wavelength region may be used. Further, with advantages of a fast response speed, safety, environmental friendliness, and easy control of a device material, the light device can also be easily used for power control, a microwave circuit, or a communication module.

Accordingly, application of the semiconductor device has expanded to a transmission module of an optical communication device, a light emitting diode (LED) backlight replacing a cold cathode fluorescent lamp (CCFL) that configures a backlight of a liquid crystal display (LCD) device, a white LED lighting device capable of replacing a fluorescent lamp or an incandescent lamp, a headlight of a vehicle, traffic lights, a sensor for detecting gas or fire, and the like. In addition, the application of the semiconductor device may be expanded to a high frequency application circuit, another power control device, and a communication module.

Particularly, a light emitting device emitting light in an ultraviolet wavelength region can be used for a hardening process and for curing, medical, and germicidal applications due to a bactericidal action.

Recently, research on ultraviolet light emitting devices has been actively carried out, but there is a problem that it is difficult to implement a vertical type ultraviolet light emitting device and crystallinity is degraded in the process of separating a substrate.

In a conventional semiconductor device, a strain can be varied in each semiconductor layer due to a lattice mismatch and a difference in thermal expansion coefficient between the semiconductor layers. The strain variation may cause dislocation or a defect in the semiconductor layer. The dislocation or defect may cause V-pits or cracks, and the V-pits or cracks may generate a leakage current.

DISCLOSURE

Technical Problem

Exemplary embodiments are directed to providing a vertical type ultraviolet semiconductor device.

Further, exemplary embodiments are directed to providing a semiconductor device having high crystallinity.

Furthermore, exemplary embodiments are directed to providing a semiconductor device with improved optical power.

Moreover, exemplary embodiments are directed to providing a semiconductor device capable of improving extraction efficiency of light by enhancing back diffusion of a p-type dopant.

Problems to be solved in the embodiments are not limited to the above-described problems, and objects and effects which can be determined from the solutions and the embodiments of the problems described below are also included.

Technical Solution

One aspect of the present invention provides a semiconductor device including a light emitting structure which includes a first conductivity type semiconductor layer, a second conductivity type semiconductor layer, an active layer disposed between the first conductivity type semiconductor layer and the second conductivity type semiconductor layer, and an intermediate layer disposed between the first conductivity type semiconductor layer and the active layer or disposed inside the first conductivity type semiconductor layer, wherein the first conductivity type semiconductor layer, the intermediate layer, the active layer, and the second conductivity type semiconductor layer may include aluminum, and the intermediate layer may include a first intermediate layer having an aluminum composition that is lower than that of the first conductivity type semiconductor layer.

The intermediate layer may include the first intermediate layer and a second intermediate layer having an aluminum concentration that is higher than that of the first intermediate layer.

An aluminum composition of the second intermediate layer may be higher than that of the first conductivity type semiconductor layer.

A plurality of first intermediate layers and a plurality of second intermediate layers may be alternately stacked.

A thickness of the first intermediate layer may be greater than that of the second intermediate layer.

A thickness ratio of the first intermediate layer to the second intermediate layer may be in a range of 2:1 to 6:1.

A total thickness of the intermediate layer may be in the range of 50 nm to 1000 nm.

The aluminum composition of the first intermediate layer may be in the range of 30% to 60%.

The aluminum composition of the second intermediate layer may be in the range of 60% to 100%.

The first conductivity type semiconductor layer may include a first-first conductivity type semiconductor layer and a first-second conductivity type semiconductor layer, and the intermediate layer may be disposed between the first-first conductivity type semiconductor layer and the first-second conductivity type semiconductor layer.

The first-second conductivity type semiconductor layer may be disposed to be closer to the active layer than the first-first conductivity type semiconductor layer.

The aluminum composition of the first-second conductivity type semiconductor layer may be lower than that of the first-first conductivity type semiconductor layer.

A thickness of the first-first conductivity type semiconductor layer may be greater than that of the first-second conductivity type semiconductor layer.

The light emitting structure may include a plurality of recesses disposed up to some region of the first-second conductivity type semiconductor layer by passing through the second conductivity type semiconductor layer and the active layer.

The semiconductor device may further include a first conductive layer disposed within each of the plurality of recesses and having a connection electrode electrically connected to the first-second conductivity type semiconductor layer.

The intermediate layer may be disposed between the first conductivity type semiconductor layer and the active layer.

The light emitting structure may include a plurality of recesses disposed up to some region of the first conductivity type semiconductor layer by passing through the second conductivity type semiconductor layer, the active layer, and the intermediate layer.

The semiconductor device may further include a first conductive layer disposed within each of the plurality of recesses and having a connection electrode electrically connected to the first conductivity type semiconductor layer.

Another aspect of the present invention provides a semiconductor device package including a body, and a semiconductor device disposed on the body, wherein the semiconductor device may include a light emitting structure including a first conductivity type semiconductor layer, a second conductivity type semiconductor layer, an active layer disposed between the first conductivity type semiconductor layer and the second conductivity type semiconductor layer, and an intermediate layer disposed between the first conductivity type semiconductor layer and the active layer or disposed inside the first conductivity type semiconductor layer. The first conductivity type semiconductor layer, the intermediate layer, the active layer, and the second conductivity type semiconductor layer may include aluminum, and the intermediate layer may include a first intermediate layer having an aluminum composition that is lower than that of the first conductivity type semiconductor layer.

Still another aspect of the present invention provides a method for manufacturing a semiconductor device which includes sequentially forming a light absorption layer and the above-described light emitting structure on a substrate and separating the light absorption layer from a first conductivity type semiconductor layer by irradiating the substrate with laser light, wherein during the separating, the light absorption layer and an intermediate layer may absorb the laser light.

Advantageous Effects

In accordance with exemplary embodiments, a vertical type ultraviolet light emitting device can be manufactured.

Further, crystallinity of the ultraviolet light emitting device can be improved.

Furthermore, optical power can be improved.

Moreover, propagation of dislocation is improved such that a threading dislocation density (TDD) of a final semiconductor layer can be reduced to improve light emission efficiency.

Additionally, since a doping concentration of a second conductivity type dopant of each of a second conductivity type semiconductor layer and an electron blocking layer (EBL) is maintained to be constant, it is possible to improve extraction efficiency of light by improving back diffusion of a p-type dopant from the EBL to an active layer.

In addition, it is possible to improve degradation of an electrical characteristic due to a leakage current by improving dislocation or a defect.

Further, fully transverse electric (TE) polarization of an ultraviolet light emitting device can be implemented by resolving the dislocation or defect.

Various beneficial advantages and effects of the present invention are not limited by the detailed description and should be easily understood through a description of a detailed embodiment of the present invention.

Modes of the Invention

The present embodiments may be modified in other forms, or various embodiments may be combined with each other, and thus the scope of the present disclosure is not limited to each embodiment described below.

Even though an item described in a specific embodiment is not described in another embodiment, unless otherwise described in the other embodiment or as long as there is no contradictory description therein, the item may be understood as being related to the other embodiment.

For example, when a feature for a configuration A is described in a specific embodiment and a feature for a configuration B is described in another embodiment, even when an embodiment in which the configuration A and the configuration B are combined is not explicitly described, unless otherwise described in the other embodiment or as long as there is no contradictory explanation therein, it should be understood that they will fall within the scope of the present disclosure.

In the description of the embodiments, when an element is described as being formed "on" or "under" another element, the terms "on" or "under" include the meaning of the two components being in direct contact with each other (directly) and the meaning of one or more other components being disposed and formed between the two components (indirectly). Also, when described as "over (upper) or below (lower), or on or under", a direction may include not only an upward direction but also a downward direction with respect to one element.

Hereinafter, embodiments of the present invention will be fully described in detail suitable for implementation by those skilled in the art to which the present invention pertains with reference to the accompanying drawings.

A light emitting structure according to an exemplary embodiment of the present invention may output light in an ultraviolet (UV) wavelength range. For example, a light emitting structure may emit light in the range of a near-UV wavelength range (UV-A), light in the range of a far-UV wavelength range (UV-B), or light in the range of a deep-UV wavelength range (UV-C). The wavelength range may be determined by an aluminum (Al) composition ratio of a light emitting structure 120.

For example, the light (UV-A) in the near-UV wavelength range may have a wavelength in the range of 320 nm to 420 nm, the light (UV-B) in the far-UV wavelength range may have a wavelength in the range of 280 nm to 320 nm, and the light (UV-C) in the deep-UV wavelength range may have a wavelength in the range of 100 nm to 280 nm.

Figure 1:
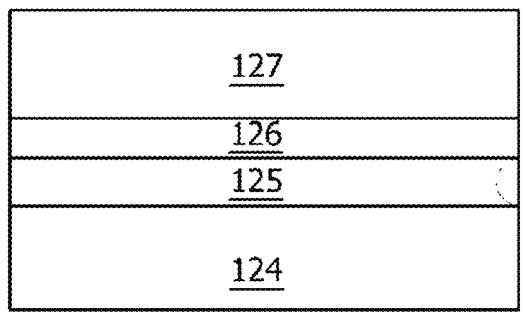
FIG. 1 is a conceptual diagram of a light emitting structure according to one embodiment of the present invention.
Figure 1:
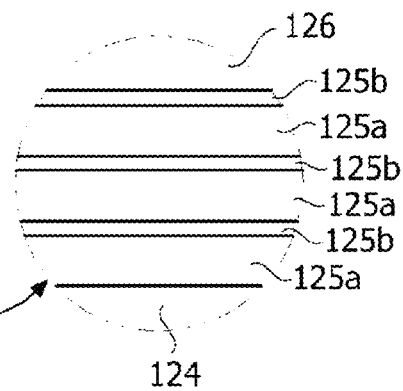

FIG. 1 is a conceptual diagram of a light emitting structure according to one embodiment of the present invention.

A light emitting structure 120A according to the present embodiment includes a first conductivity type semiconductor layer 124, a second conductivity type semiconductor layer 127, an active layer 126, and an intermediate layer 125 disposed between the first conductivity type semiconductor layer 124 and the active layer 126.

The first conductivity type semiconductor layer 124, the intermediate layer 125, the active layer 126, and the second conductivity type semiconductor layer 127 include Al. An Al composition may be controlled according to a desired UV wavelength range.

The first conductivity type semiconductor layer 124 may be formed of a Group III-IV or II-V compound semiconductor and may be doped with a first dopant. The first conductivity type semiconductor layer 124 may be formed of a semiconductor material having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), e.g., a semiconductor material selected from among GaN, AlGaN, InGaN, InAlGaN, and the like. Further, the first dopant may be an n-type dopant such as Si, Ge, Sn, Se, or Te. When the first dopant is an n-type dopant, the first conductivity type semiconductor layer 124 doped with the first dopant may be an n-type semiconductor layer.

The active layer 126 is disposed between the first conductivity type semiconductor layer 124 and the second conductivity type semiconductor layer 127. The active layer 126 is a layer at which electrons (or holes) injected through the first conductivity type semiconductor layer 124 and holes (or electrons) injected through the second conductivity type semiconductor layer 127 meet. In the active layer 126, electrons and holes may transition to a low energy level due to the recombination thereof and the active layer 126 may emit light having a UV wavelength.

The active layer 126 may have any one of a single well structure, a multi-well structure, a single quantum well structure, a multi quantum well (MQW) structure, a quantum dot structure, or a quantum wire structure, but the structure of the active layer 126 is not limited thereto.

The intermediate layer 125 may be disposed between the first conductivity type semiconductor layer 124 and the active layer 126. The intermediate layer 125 includes a first intermediate layer 125a having an Al composition that is lower than that of the first conductivity type semiconductor layer 124, and a second intermediate layer 125b having an Al composition that is higher than that of the first conductivity type semiconductor layer 124. A plurality of first intermediate layers 125a and a plurality of second intermediate layers 125b may be alternately disposed.

The Al composition of the first intermediate layer 125a may be lower than the Al composition of the first conductivity type semiconductor layer 124. During a laser lift-off (LLO) process, the first intermediate layer 125a may absorb laser light irradiated onto the light emitting structure 120 to serve to prevent damage to the active layer 126. Therefore, the semiconductor device according to the present embodiment may reduce the damage to the active layer, thereby improving optical power, an electrical characteristic, and reliability.

A thickness and the Al composition of the first intermediate layer 125a may be appropriately adjusted to absorb the laser light irradiated onto the light emitting structure 120 during the LLO process. The Al composition of the first intermediate layer 125a may be in the range of 30% to 60%, and the thickness thereof may be in the range of 1 nm to 10 nm. For example, the first intermediate layer 125a may be formed of AlGaN, but the present invention is not particularly limited thereto.

The Al composition of the second intermediate layer 125b may be higher than the Al composition of the first conductivity type semiconductor layer 124. The second intermediate layer 125b increases an Al composition lowered by the first intermediate layer 125a such that a propagation direction of a lattice defect transmitted from a lower portion of the intermediate layer 125 may be changed at an interface between the first intermediate layer 125*a* and the second intermediate layer 125*b*. A plurality of lattice defects may be merged with each other at the interface such that lattice defects propagating above the intermediate layer 125 may be reduced.

Thus, a lattice defect of an epi-layer grown on the intermediate layer 125 may be reduced and crystallinity may be improved. Further, owing to a difference in refractive index resulting from the Al content difference from that of the first conductivity type semiconductor layer 124, extraction efficiency of light may be improved.

For example, the Al composition of the second intermediate layer 125*b* may be in the range of 60% to 100%, and a thickness thereof may be in the range of 0.1 nm to 2.0 nm. The second intermediate layer 125*b* may be made of AlGaN or AlN, but the present invention is not particularly limited thereto.

For example, in order to absorb laser light having a 246 nm wavelength, the thickness of the first intermediate layer 125*a* may be greater than that of the second intermediate layer 125*b*. The thickness of the first intermediate layer 125*a* may be in the range of 1.0 nm to 10.0 nm, and the thickness of the second intermediate layer 125*b* may be in the range of 0.5 nm to 2.0 nm.

A thickness ratio (a first intermediate layer: a second intermediate layer) of the first intermediate layer 125*a* to the second intermediate layer 125*b* may be in the range of 2:1 to 6:1. When the thickness ratio is greater than 2:1, it is possible to secure a thickness of the first intermediate layer that is able to sufficiently absorb laser light, and when the thickness ratio is smaller than 6:1, the thickness of the second intermediate layer may be secured to control a Al composition of the first and second intermediate layers.

When the thickness ratio is less than 2:1, the first intermediate layer 125*a* becomes thinner and it is difficult to sufficiently absorb the laser light, whereas when the thickness ratio is greater than 6:1, the second intermediate layer 125*b* becomes too thin such that the Al composition of the first and second intermediate layers becomes lower.

A total thickness of the intermediate layer 125 may be in the range of 50 nm to less than 1000 nm. When such a range is satisfied, crystallinity may be maintained while the laser light is sufficiently absorbed. When the total thickness is less than 50 nm, the thickness of the first intermediate layer 125*a* becomes thinner and thus it is difficult to sufficiently absorb the 246 nm laser light, whereas when the total thickness is greater than 1000 nm, the Al composition of the intermediate layer becomes lower and thus the crystallinity is degraded.

The second conductivity type semiconductor layer 127 may be formed on the active layer 126, may be formed of a Group III-V or II-VI compound semiconductor, and may be doped with a second dopant. The second conductivity type semiconductor layer 127 may be formed of a material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or may be formed of a material selected from among AlInN, AlGaAs, GaP, GaAs, GaAsP, and AlGaInP. When the second dopant is a p-type dopant such as Mg, Zn, Ca, Sr, or Ba, the second conductivity type semiconductor layer 127 doped with the second dopant may be a p-type semiconductor layer.

When the second conductivity type semiconductor layer 127 is made of AlGaN, hole injection may not be smooth due to low electrical conductivity of AlGaN. Accordingly, GaN having a relatively high electrical conductivity and a polarity identical to that of the second conductivity type semiconductor layer 126 may be disposed on a lower surface of the second conductivity type semiconductor layer 127. However, the present invention is not particularly limited thereto, and the Al composition of the second conductivity type semiconductor layer 127 may be reduced to the range of 1% to 10% such that an ohmic contact may be formed between a second electrode and the second conductivity type semiconductor layer 127.

Figure 2:
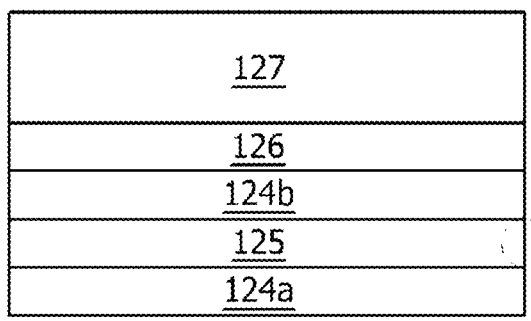
FIG. 2 is a conceptual diagram of a light emitting structure according to another embodiment of the present invention.
Figure 2:
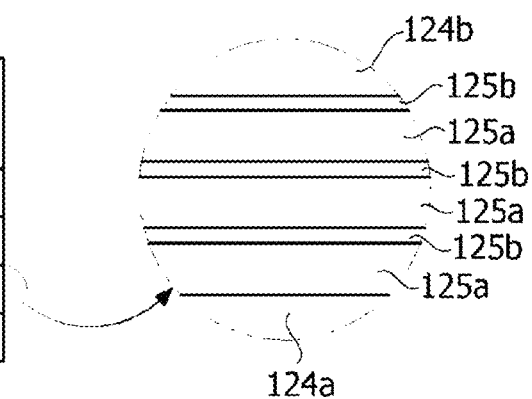

FIG. 2 is a conceptual diagram of a light emitting structure according to another embodiment of the present invention.

A light emitting structure 120B according to the present embodiment includes first conductivity type semiconductor layers 124*a* and 124*b*, a second conductivity type semiconductor layer 127, an active layer 126 disposed between the first conductivity type semiconductor layers 124*a* and 124*b* and the second conductivity type semiconductor layer 127, and an intermediate layer 125 disposed between the first conductivity type semiconductor layers 124*a* and 124*b*.

The first conductivity type semiconductor layers 124*a* and 124*b* include a first-first conductivity type semiconductor layer 124*a* and a first-second conductivity type semiconductor layer 124*b*, and an intermediate layer 125 may be disposed between the first-first conductivity type semiconductor layer 124*a* and the first-second conductivity type semiconductor layers 124*b*.

The first-second conductivity type semiconductor layers 124*b* may be disposed to be closer to the active layer 126 than the first-first conductivity type semiconductor layer 124*a*. An Al composition of the first-second conductivity type semiconductor layers 124*b* may be lower than that of the first-first conductivity type semiconductor layer 124*a*. The Al composition of the first-second conductivity type semiconductor layer 124*b* may be in the range of 40% to 70%, and the Al composition of the first-first conductivity type semiconductor layer 124*a* may be in the range of 50% to 80%.

A thickness of the first-second conductivity type semiconductor layer 124*b* may be thinner than that of the first-first conductivity type semiconductor layer 124*a*. The first-first conductivity type semiconductor layer 124*a* may have a thickness of 130% or more relative to the thickness of the first-second conductivity type semiconductor layer 124*b*. According to such a structure, since the intermediate layer 125 is formed after the first-first conductivity type semiconductor layer 124*a* having a high Al composition is sufficiently grown, overall crystallinity of the light emitting structure 120 may be improved.

The configuration described in FIG. 1 may be directly applied to a configuration (the Al composition, the thickness, and the like) of the intermediate layer 125. The intermediate layer 125 may be doped with a first dopant as necessary.

Figure 3:
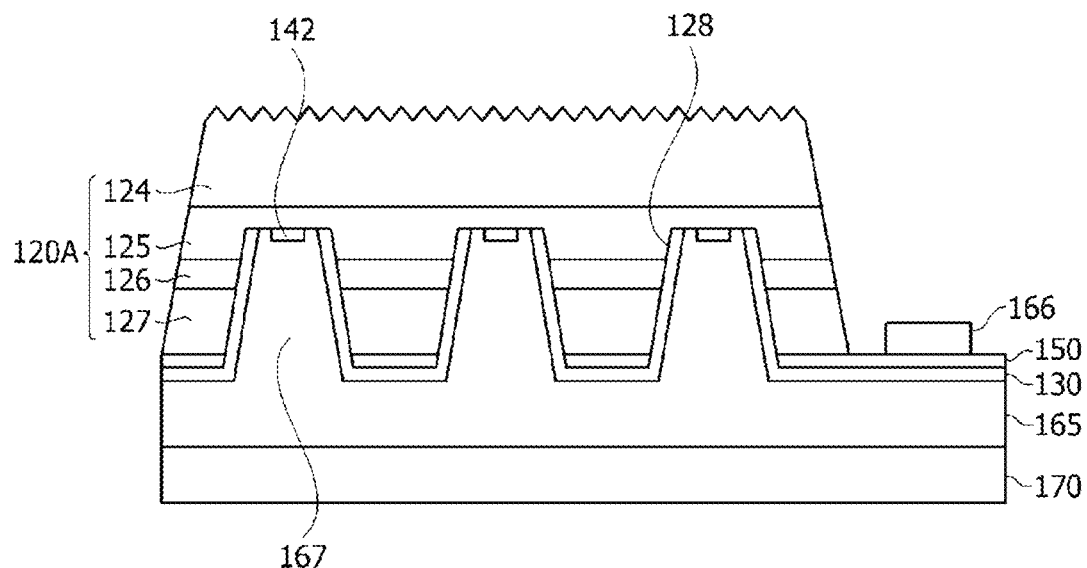
FIG. 3 is a conceptual diagram of a semiconductor device according to one embodiment of the present invention.
Figure 4:
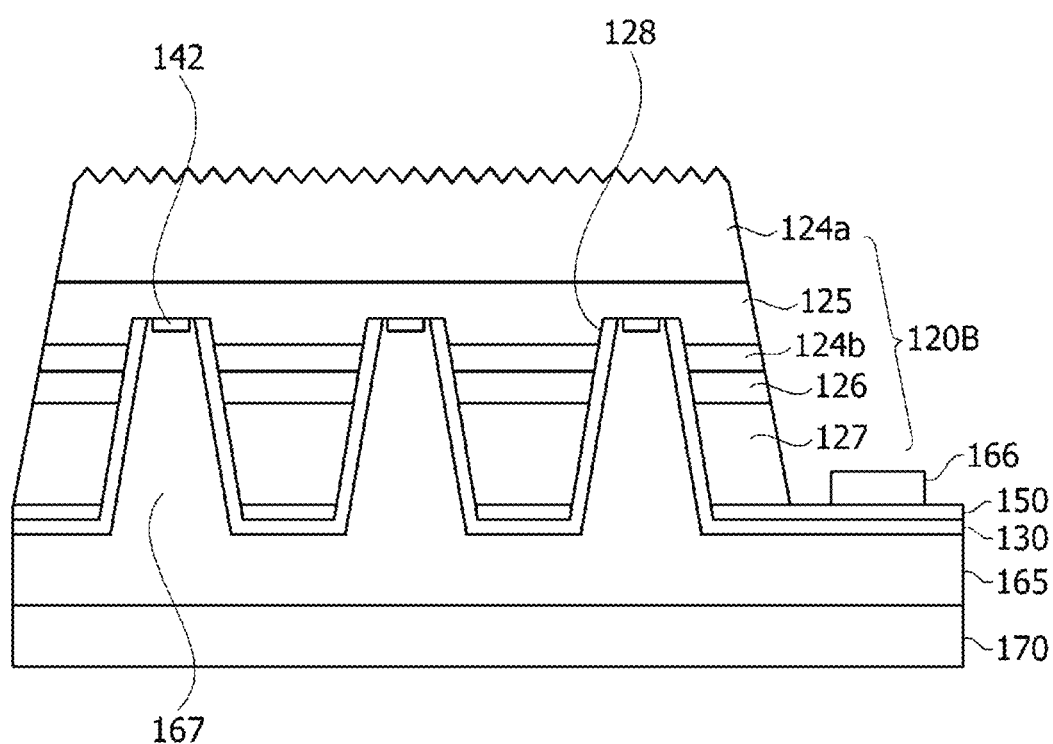
FIG. 4 is a conceptual diagram of a semiconductor device according to another embodiment of the present invention.

FIG. 3 is a conceptual diagram of a semiconductor device according to one embodiment of the present invention, and FIG. 4 is a conceptual diagram of a semiconductor device according to another embodiment of the present invention.

The structure described in FIG. 1 may be directly applied to a structure of a light emitting structure 120A. Referring to FIG. 3, a recess 128 may be disposed up to some region of an intermediate layer 125 by passing through a second conductivity type semiconductor layer 127 and an active layer 126.

A first electrode 142 may be in contact with the intermediate layer 125 to be electrically connected to the first conductivity type semiconductor layer 124. The intermediate layer 125 has an Al composition that is lower than that of the first conductivity type semiconductor layer 124 such that the intermediate layer 125 may be advantageous for distributing a current. However, the present invention is not particularly limited thereto, and the recess 128 may be disposed in some region of the first conductivity type semiconductor layer 124 by passing through the intermediate layer 125.

The intermediate layer 125 may be doped with an n-type dopant. Accordingly, the intermediate layer 125 may be defined as a first-third conductivity type semiconductor layer having a low Al composition in the first conductivity type semiconductor layer 124.

A first conductive layer 165 includes a connection electrode 167 disposed in the recess 128 and electrically connected to the first conductivity type semiconductor layer 124. The first electrode 142 may be disposed between the connection electrode 167 and the first conductivity type semiconductor layer 124. The first electrode 142 may be an ohmic electrode.

The first recess 128 may be disposed such that a distance from an upper surface of the recess 128 to an upper surface of the light emitting structure becomes a value in the range of 1 μm to 4 μm. When the distance from the upper surface of the light emitting structure to the upper surface of the recess 128 is less than 1 μm, reliability of a light emitting device may be degraded, whereas when the distance from the upper surface of the light emitting structure to the upper surface of the recess 128 exceeds 4 μm, extraction efficiency of light may be degraded due to a crystal defect and the like in the light emitting structure.

The second conductive layer 150 may be disposed on a lower surface of the second conductivity type semiconductor layer 127 and electrically connected thereto. The second conductive layer 150 may be disposed in a region between a plurality of connection electrodes 167. One region of the second conductive layer 150 may be exposed to be electrically connected to an electrode pad. Although not shown in the drawing, a second electrode (ohmic electrode) may be disposed between the second conductive layer 150 and a second conductivity type semiconductor layer 127.

Each of the first conductive layer 165 and the second conductive layer 150 may be formed of a transparent conductive oxide (TCO) film. The TCO film may be formed of a material selected from among an indium tin oxide (ITO), an indium zinc oxide (IZO), an aluminum zinc oxide (AZO), an aluminum gallium zinc oxide (AGZO), an indium zinc tin oxide (IZTO), an indium aluminum zinc oxide (IAZO), an indium gallium zinc oxide (IGZO), an indium gallium tin oxide (IGTO), an antimony tin oxide (ATO), a GZO, an IZO nitride (IZON), ZnO, $IrO_x$, $RuO_x$, NiO, and the like.

The first conductive layer 165 and the second conductive layer 150 may include an opaque metal such as Ag, Ni, Al, Rh, Pd, Ir, Ru, Mg, Zn, Pt, Au, Hf, or the like. Further, the first conductive layer 165 may be configured with one or a plurality of layers made of a mixture of a TCO film and an opaque metal, but the present invention is not limited thereto.

An insulating layer 130 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but the present invention is not limited thereto. The insulating layer 130 may electrically insulate the connection electrode 167 from the active layer 126 and the second conductivity type semiconductor layer 127.

FIG. 4 is a conceptual diagram of a semiconductor device according to another embodiment of the present invention.

The structure described in FIG. 2 may be directly applied to a structure of a light emitting structure 120B. Referring to FIG. 4, the first conductivity type semiconductor layer 124 may include a first-first conductivity type semiconductor layer 124a and a first-second conductivity type semiconductor layers 124b, and an intermediate layer 125 and may be disposed between the first-first conductivity type semiconductor layer 124a and the first-second conductivity type semiconductor layer 124b.

A recess 128 may be disposed up to some region of the intermediate layer 125 by passing through a second conductivity type semiconductor layer 127, an active layer 126, and the first-second conductivity type semiconductor layer 124b. The intermediate layer 125 has an Al composition that is lower than that of the first conductivity type semiconductor layer 124 such that the intermediate layer 125 is advantageous for distributing a current.

However, the present invention is not particularly limited thereto, and the recess 128 may be disposed in some region of the first-second conductivity type semiconductor layer 124b.

In this case, the first-second conductivity type semiconductor layer 124b may be disposed to be closer to the active layer 126 than the first-first conductivity type semiconductor layer 124a, and an Al composition and a thickness of the first-second conductivity type semiconductor layer 124b may be less than an Al composition and a thickness of the first-first conductivity type semiconductor layer 124a.

A thickness of a second intermediate layer 125b may be in the range of 500 nm to 1000 nm. A thickness of a first intermediate layer 125a may be in the range of 600 nm to 1500 nm. The thickness of the first intermediate layer 125a may be varied according to a depth of an irregularity pattern.

The light emitting structure 120 may include a plurality of recesses 128 disposed in some region of the first-second conductivity type semiconductor layer 124b by passing through the second conductivity type semiconductor layer 127 and the active layer 126.

A first conductive layer 165 may include a connection electrode 167 disposed inside each of the plurality of recesses 128 and electrically connected to the first-second conductivity type semiconductor layer 124b, and a first electrode 142 disposed between the first-second conductivity type semiconductor layer 124b and the connection electrode 167. The first-second conductivity type semiconductor layer 124b has a relatively low Al content such that the first-second conductivity type semiconductor layer 124b may be advantageous for injecting and distributing a current. However, the present invention is not particularly limited thereto, and the first-first conductivity type semiconductor layer 124a and the first-second conductivity type semiconductor layer 124b may have the same Al composition, and the recess 128 may be formed up to some region of the first-first conductivity type semiconductor layer 124a.

Figure 5A:
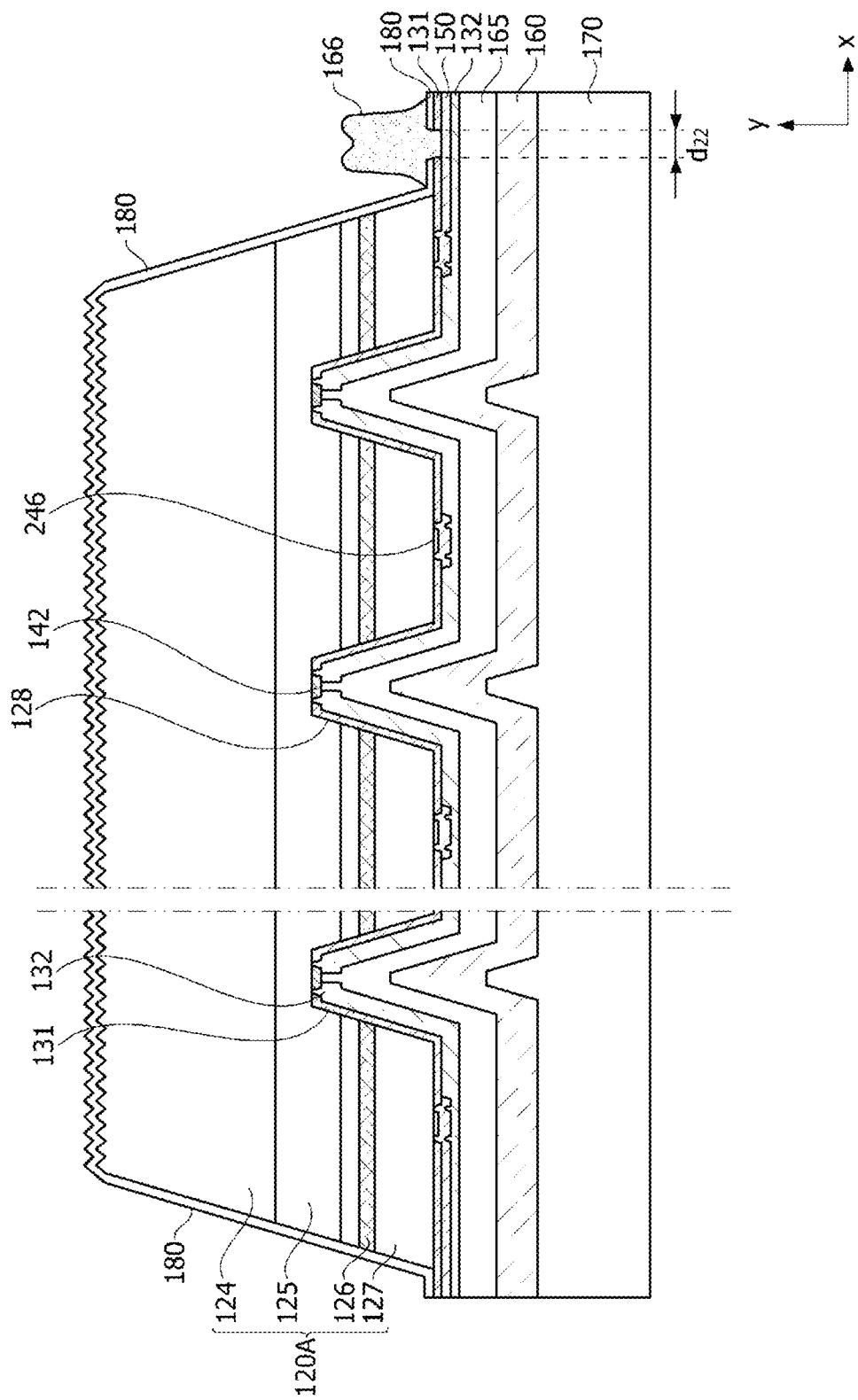
FIG. 5A is a conceptual diagram of a semiconductor device according to still another embodiment of the present invention.
Figure 5B:
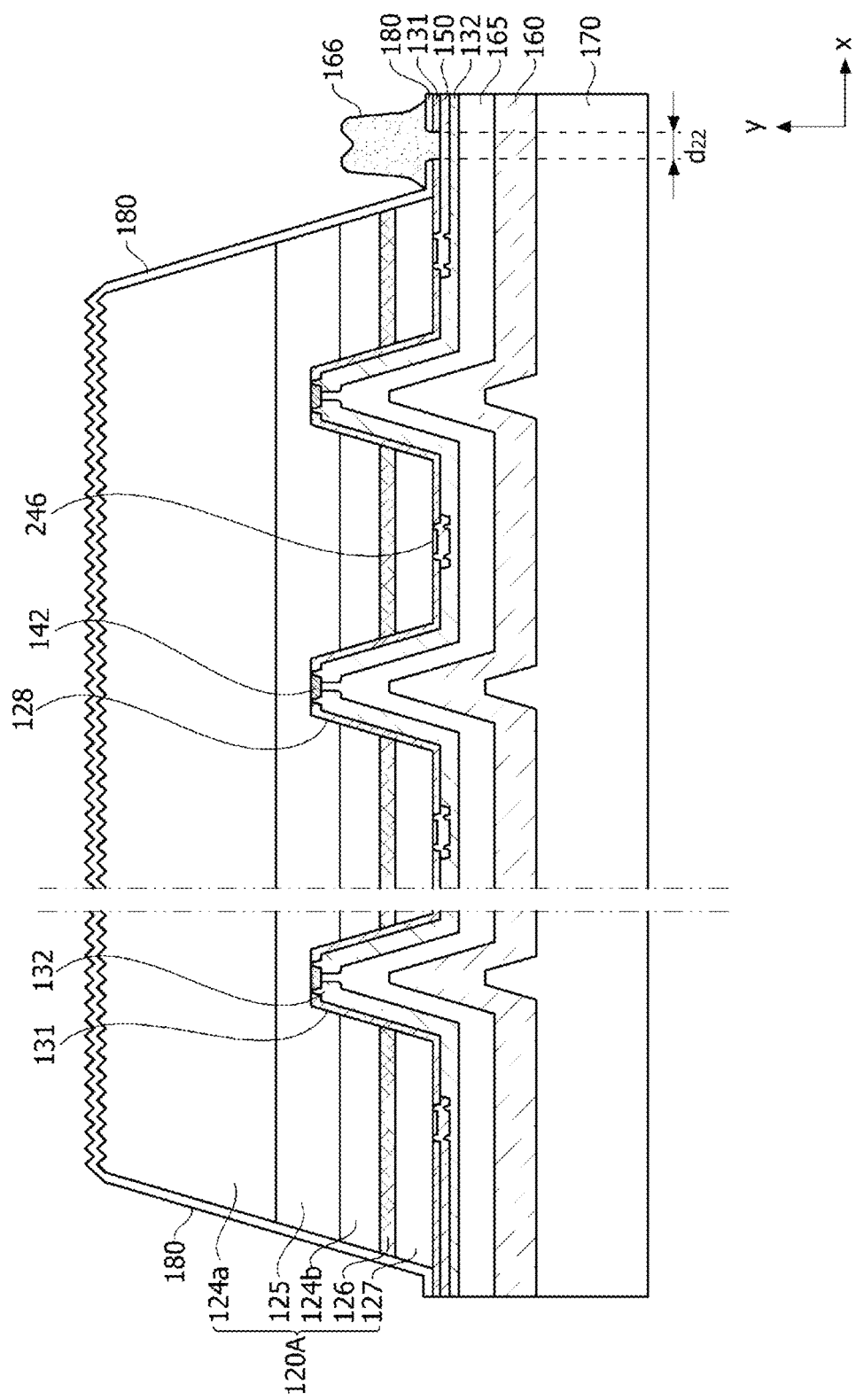
FIG. 5B is a modified embodiment of FIG. 5A.

FIG. 5A is a conceptual diagram of a semiconductor device according to still another embodiment of the present invention, and FIG. 5B is a modified embodiment of FIG. 5A.

The configuration of the light emitting structure 120 described in FIG. 1 may be directly applied to a configuration of a light emitting structure 120 of FIG. 5A. A recess 128 may be disposed up to some region of an intermediate layer 125 by passing through a second conductivity type semiconductor layer 127 and an active layer 126. However, the present invention is not particularly limited thereto, and the recess 128 may be disposed in some region of the light emitting structure 120A by passing through the intermediate layer 125.

Referring to FIG. 5B, the recess 128 may be disposed up to some region of the intermediate layer 125 by passing through the second conductivity type semiconductor layer 127, the active layer 126, and a first-second conductivity type semiconductor layer 124b.

The intermediate layer 125 has an Al composition that is lower than that of the first conductivity type semiconductor layer 124 such that the intermediate layer 125 is advantageous for distributing a current. The intermediate layer 125 may be doped with an n-type dopant. However, the present invention is not particularly limited thereto, and the recess 128 may be disposed in some region of the first-second conductivity type semiconductor layer 124b.

A first electrode 142 may be disposed on an upper surface of the recess 128 to be electrically connected to the first conductivity type semiconductor layer 124. A second electrode 246 may be disposed at a lower portion of the second conductivity type semiconductor layer 127.

The first electrode 142 and the second electrode 246 may be ohmic electrodes. The first electrode 142 and the second electrode 246 may be formed of at least one among an ITO, IZO, an IZTO, an IAZO, an IGZO, an IGTO, an AZO, an ATO, a GZO, IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited to these materials.

A second electrode pad 166 may be disposed at an edge of one side of the semiconductor device. A central portion of the second electrode pad 166 is depressed so that an upper surface of the second electrode pad 166 may have a concave portion and a convex portion. A wire (not shown) may be bonded to the concave portion of the upper surface. Thus, a bonding area may be widened so that the second electrode pad 166 and the wire may be more firmly bonded.

The second electrode pad 166 may serve to reflect light so that extraction efficiency of light may be improved as the second electrode pad 166 is disposed to be close to the light emitting structure 120.

A height of the convex portion of the second electrode pad 166 may be higher than that of the active layer 126. Accordingly, the second electrode pad 166 may reflect light, which is emitted from the active layer 126 in a horizontal direction of the device, upward, thereby improving the extraction efficiency of light and controlling directivity of the light.

A first insulating layer 131 is partially open at a lower portion of the second electrode pad 166 such that a second conductive layer 150 and the second electrode 246 may be electrically connected. A passivation layer 180 may be formed on an upper surface and a lateral surface of the light emitting structure 120. The passivation layer 180 may be a region adjacent to the second electrode 246 but may be in contact with the first insulating layer 131 below the second electrode 246.

For example, a width d22 of a portion at which the first insulating layer 131 is open and thus the second electrode 246 is in contact with the second conductive layer 150 may be in the range of 40 μm to 90 μm. When the width d22 is less than 40 μm, an operating voltage may rise, whereas when the width d22 is greater than 90 μm, it may be difficult to secure a process margin for not exposing the second conductive layer 150 to the outside. When the second conductive layer 150 is exposed to an outer region of the second electrode 246, reliability of the light emitting device may be degraded. Accordingly, the width d22 may preferably fall in the range of 60% to 95% relative to an overall width of the second electrode pad 166.

The first insulating layer 131 may electrically insulate the first electrode 142 from the active layer 126 and the second conductivity type semiconductor layer 127. Further, the first insulating layer 131 may electrically insulate the second electrode 246 and the second conductive layer 150 from a first conductive layer 165.

The insulating layer 131 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but the present invention is not limited thereto. The first insulating layer 131 may be formed with a single layer or a multilayer. For example, the first insulating layer 131 may be a distributed Bragg reflector (DBR) having a multilayered structure including an AlSi oxide or a Ti compound. However, the present invention is not limited thereto, and the first insulating layer 131 may include various reflective structures.

When the first insulating layer 131 performs a function of insulating, light emitted from the active layer 126 toward a lateral surface of thereof may be reflected upward to improve extraction efficiency of the light. As described below, in a UV semiconductor device, as the number of recesses 128 is increased, the extraction efficiency of the light may be more effective.

The second conductive layer 150 may cover the second electrode 246. Thus, the second electrode pad 166, the second conductive layer 150, and the second electrode 246 may form one electrical channel.

The second conductive layer 150 may completely surround the second electrode 246 to be in contact with a lateral surface and an upper surface of the first insulating layer 131. The second conductive layer 150 may be formed of a material having high adhesive strength to the first insulating layer 131, formed of at least one material selected from the group consisting of Cr, Al, Ti, Ni, Au, and the like, and an alloy thereof, and formed of a single layer or a plurality of layers.

When the second conductive layer 150 is in contact with the lateral surface and the upper surface of the first insulating layer 131, thermal and electrical reliability of the second electrode 246 may be improved. Further, the second conductive layer 150 may have a function of reflecting the light, which is emitted between the first insulating layer 131 and the second electrode 246, upward.

The second conductive layer 150 may be disposed within a second separation distance corresponding to a region in which the second conductivity type semiconductor layer is exposed between the first insulating layer 131 and the second electrode 246. The second conductive layer 150 may be in contact with a lateral surface and an upper surface of the second electrode 246 and a lateral surface and an upper surface of the first insulating layer 131 within the second separation distance.

Further, a region in which the second conductive layer 150 is in contact with the second conductivity type semiconductor layer 127 may be disposed within the second separation distance to form a Schottky junction such that a current may be easily distributed.

A second insulating layer 132 electrically insulates the second electrode 246 and the second conductive layer 150 from the first conductive layer 165. The first conductive layer 165 may be electrically connected to the first electrode 142 by passing through the second insulating layer 132.

The first conductive layer 165 and a bonding layer 160 may be disposed along a lower surface of the light emitting structure 120 and topography of the recess 128. The first conductive layer 165 may be formed of a material having high reflectance. For example, the first conductive layer 165 may include Al. When the first conductive layer 165 includes Al, the first conductive layer 165 serves to reflect the light, which is emitted from the active layer 126, upward such that extraction efficiency of the light may be improved.

The bonding layer 160 may include a conductive material. For example, the bonding layer 160 may include a material selected from the group consisting of gold (Au), Sn, In, Al, Si, Ag, Ni, and copper (Cu), or an alloy thereof.

A substrate 170 may be formed of a conductive material. For example, the substrate 170 may include a metal or a semiconductor material. The substrate 170 may be a metal having high electrical conductivity and/or high thermal conductivity. In this case, heat generated while the semiconductor device operates may be rapidly discharged to the outside.

The substrate 170 may include a material selected from the group consisting of Si, molybdenum (Mo), Si, tungsten (W), Cu, and Al, or an alloy thereof.

Irregularities may be formed on the upper surface of the light emitting structure 120. The irregularities may improve extraction efficiency of the light emitted from the light emitting structure 120. The irregularities may have different average heights according to a UV wavelength, and, in the case of UV-C, when a height of each of the irregularities is in the range of 300 nm to 800 nm and an average height of each thereof is in the range of 500 nm to 600 nm, the extraction efficiency of the light may be improved.

Figure 6A:
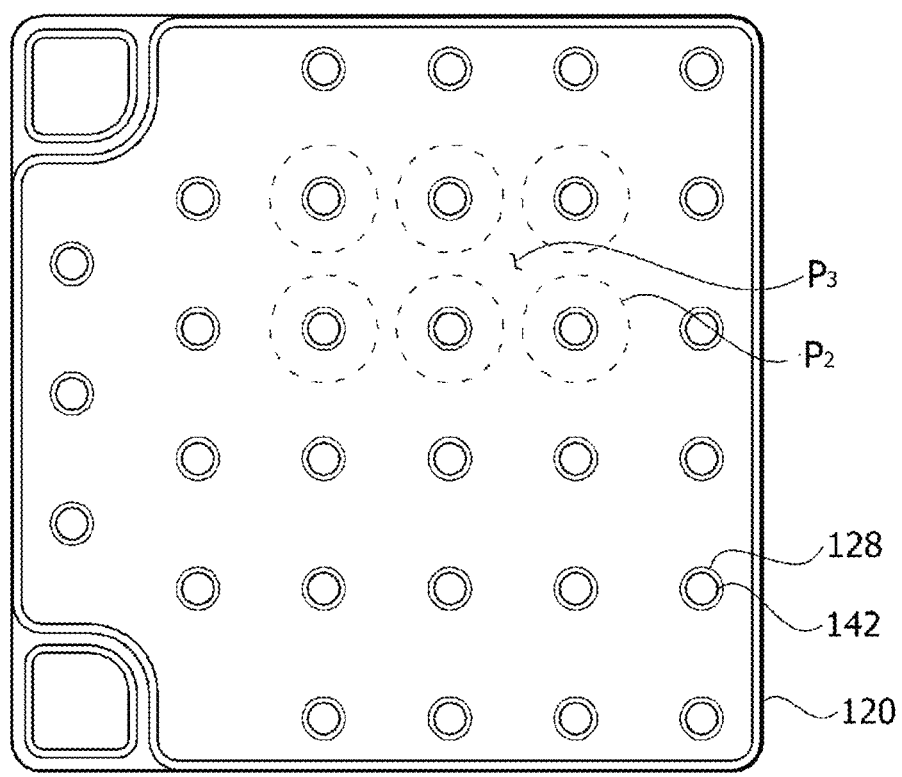
FIGS. 6A and 6B are plan views of the semiconductor device according to the embodiments of the present invention.
Figure 6B:
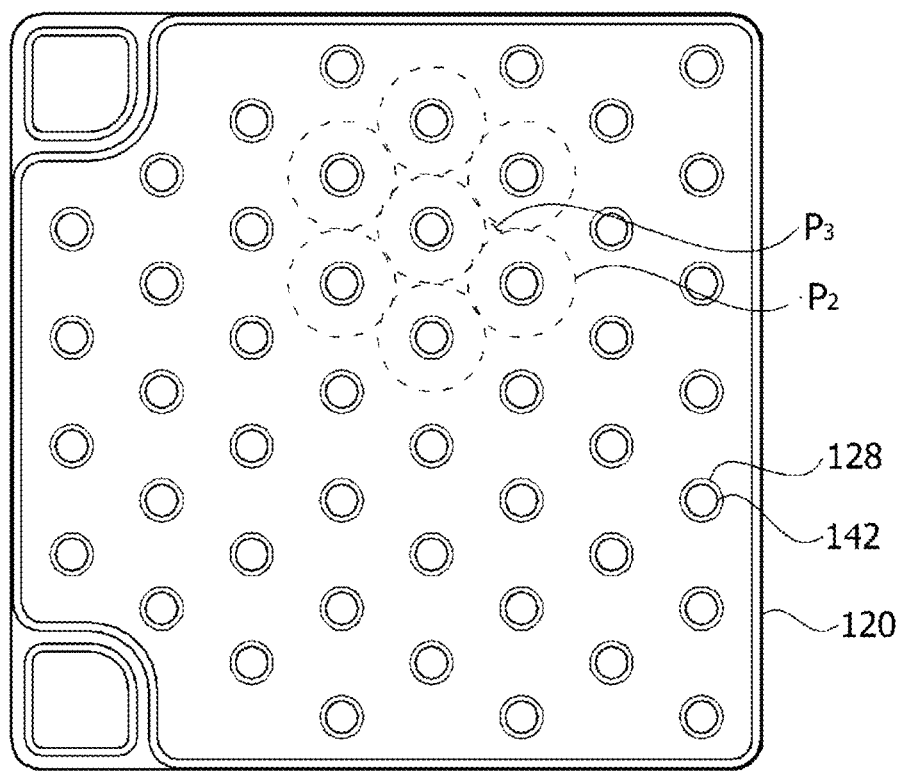

FIGS. 6A and 6B are plan views of the semiconductor device according to the embodiments of the present invention.

When the Al composition of the light emitting structure 120 increases, a current diffusion characteristic inside the light emitting structure 120 may be degraded. Further, the active layer 126 increases a quantity of light emitted to the lateral surface thereof (i.e., a transverse magnetic (TM) mode) when compared to a GaN-based blue light emitting device. The TM mode may be generated in the UV semiconductor device.

According to the present embodiment, when compared to a GaN semiconductor emitting blue light, a relatively large number of recesses 128 may be formed in a GaN semiconductor emitting light in a UV wavelength region for current diffusion and the first electrode 142 may be disposed at each of the large number of recesses 128.

Referring to FIG. 6A, when an Al composition increases, a current distribution characteristic may be degraded. Accordingly, a current is distributed to only a position adjacent to each of the first electrodes 142 such that a current density may be drastically lowered at a position away from each of the first electrodes 142. Therefore, an effective light emitting region P2 may become narrower. The effective light emitting region P2 may be defined as a boundary position with a current density of 40% or less relative to a position P1 in the vicinity of the first electrode, which has a highest current density. For example, the effective light emitting region P2 may be adjusted according to a level of an injected current and the Al composition in a region within 40 μm from a center of the recess 128.

Specifically, a low current density region P3 between adjacent first electrodes 142 has a low current density and thus hardly contributes to light emission. Therefore, in the present embodiment, the first electrodes 142 are disposed more in the low current density region P3 having a low current density such that optical power may be improved.

Generally, since a GaN semiconductor layer has a relatively high current diffusion characteristic, areas of the recess 128 and the first electrode 142 may be preferable to be minimized. This is because an area of the active layer 126 becomes smaller as the areas of the recess 128 and the first electrode 142 become larger. However, in the present embodiment, since the current diffusion characteristic is relatively low due to a high Al composition, it may be preferable to reduce the low current density region P3 by increasing the number of the first electrodes 142 even though the area of the active layer 126 is sacrificed.

Referring to FIG. 6B, when the number of recesses 128 is 48, the recesses 128 may not be disposed straight in horizontal and vertical directions and may be disposed in a zigzag manner. In this case, the area of the low current density region P3 becomes narrower so that most of the active layers may be involved in light emission. When the number of recesses 128 is in the range of 70 to 110, a current may be more efficiently distributed such that an operating voltage may be further lowered and optical power may be improved. In a semiconductor device emitting UV-C light, when the number of recesses 128 is less than 70, electrical and optical characteristics may be degraded, whereas when the number of recesses 128 is greater than 110, the electrical characteristic may be improved, but a volume of the light emitting layer is reduced such that the optical characteristic may be degraded.

A first area in which the plurality of first electrodes 142 are in contact with the first conductivity type semiconductor layer 122 may be in the range of 7.4% to 20% or in the range of 10% to 20% of a maximum cross-sectional area of the light emitting structure 120 in the horizontal direction. The first area may be the sum of areas in which the first electrodes 142 are in contact with the first conductivity type semiconductor layers 122.

When the first area of the plurality of first electrodes 142 is less than 7.4%, the optical power is reduced due to an insufficient current diffusion characteristic, whereas when the first area exceeds 20%, the areas of the active layer and the second electrode are excessively reduced such that an operating voltage rises and the optical power is reduced.

Further, a total area of the plurality of recesses 128 may be in the range of 13% to 30% relative to the maximum cross-sectional area of the light emitting structure 120 in the horizontal direction. When the total area of the plurality of recesses 128 does not satisfy the above-described condition, it is difficult to control an overall area of the first electrodes 142 to be in the range of 7.4% to 20%. Further, there is a problem in that the operating voltage rises and the optical power is reduced.

A second area in which the second electrodes 246 are in contact with the second conductivity type semiconductor layer 126 may be in the range of 35% to 70% of the maximum cross-sectional area of the light emitting structure 120 in the horizontal direction. The second area may be a total area in which the second electrodes 246 are in contact with the second conductivity type semiconductor layers 126.

When the second area is less than 35%, an area of the second electrode becomes excessively smaller such that there is a problem in that the operating voltage rises and hole injection efficiency is lowered. When the second area exceeds 70%, the first area cannot be effectively widened such that there is a problem in that electron injection efficiency is lowered.

The first area and the second area have an inverse relationship. That is, when the number of recesses is increased in order to increase the number of the first electrodes, the area of the second electrode is decreased. To increase the optical power, a distribution characteristic of electrons and holes should be balanced. Therefore, it is important to appropriately determine a ratio of the first area to the second area.

An area ratio of the first area in which the plurality of first electrodes are in contact with the first conductivity type semiconductor layer to the second area in which the plurality of second electrodes are in contact with the second conductivity type semiconductor layer (the first area: the second area) may be in the range of 1:3 to 1:10.

When the area ratio is greater than 1:10, the first area is relatively small such that the current distribution characteristic may be degraded. Further, when the area ratio is less than 1:3, there is a problem in that the second area becomes relatively smaller.

Figure 7:
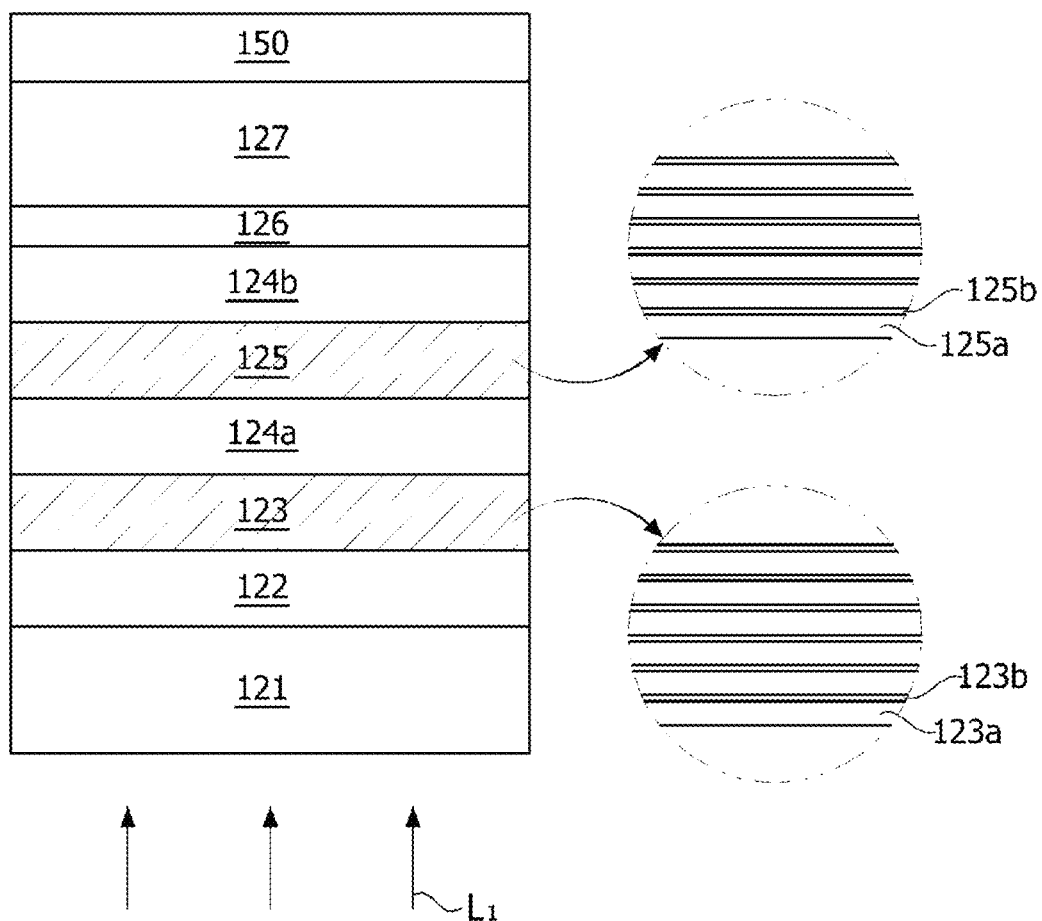
FIG. 7 is a conceptual diagram of a light emitting structure having a light absorbing layer and an intermediate layer formed therein.
Figure 8:
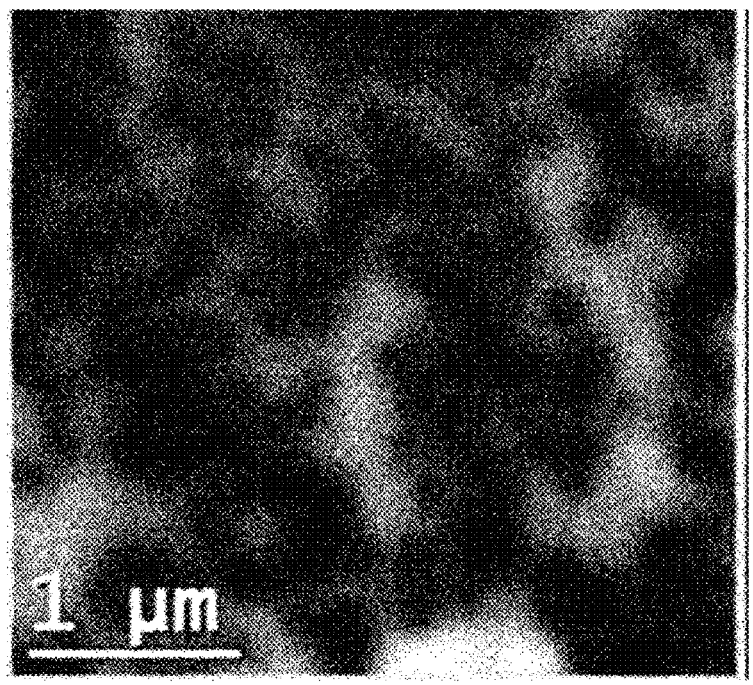
FIG. 8 is a cross-sectional photograph of the light absorbing layer having a bulk structure.
Figure 9:
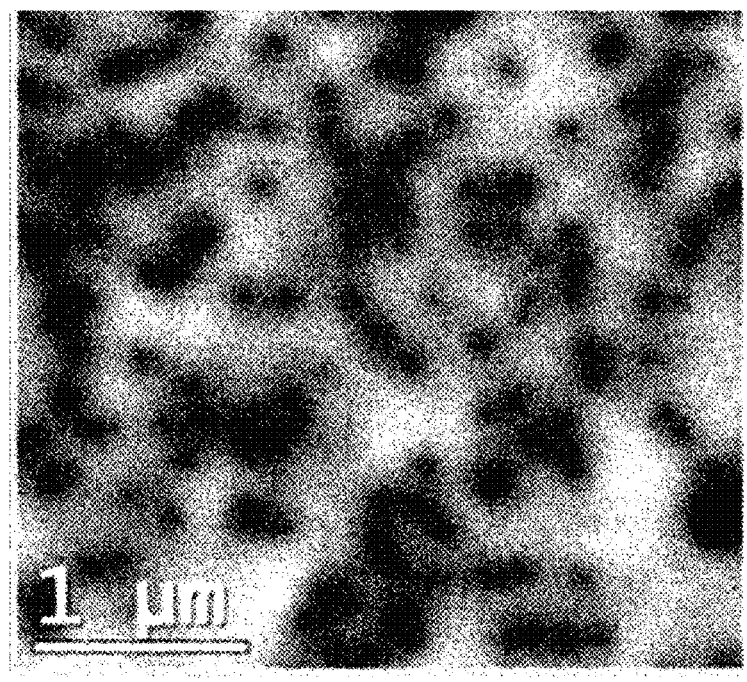
FIG. 9 is a cross-sectional photograph of the light absorption layer having a superlattice structure.
Figure 10:
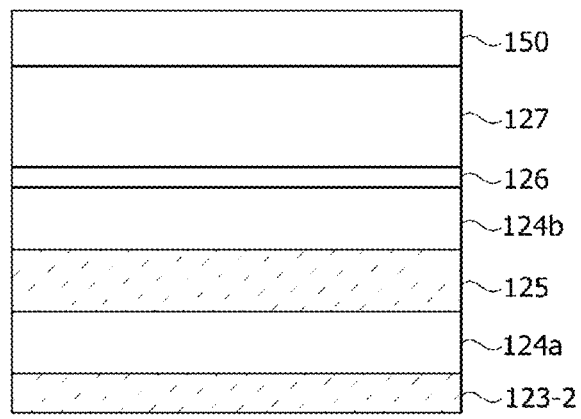
FIG. 10 is a diagram for describing a process of separating a substrate.
Figure 10:
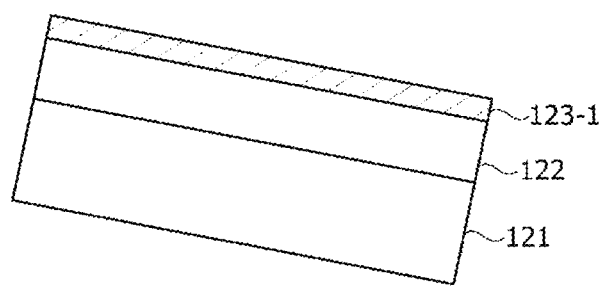
Figure 11:
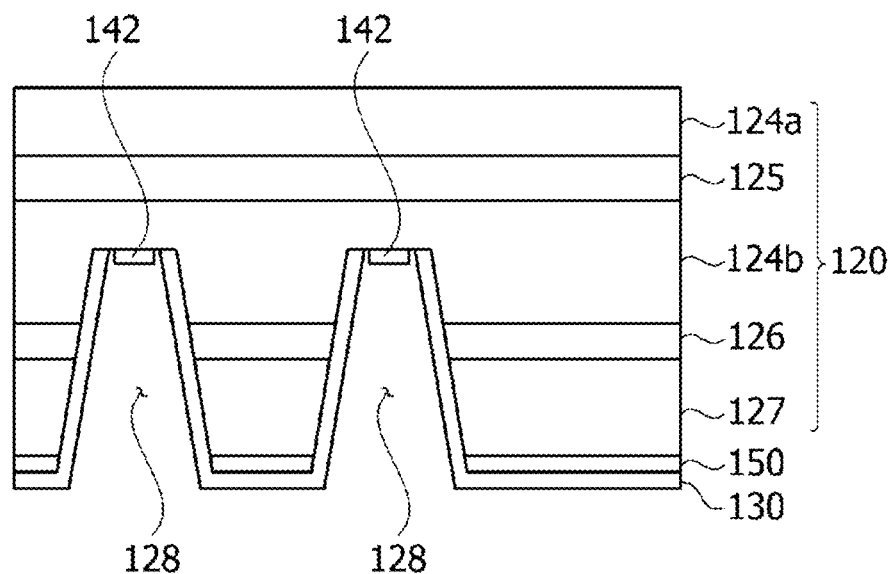
FIG. 11 is a diagram for describing a process of etching a light emitting structure.
Figure 12:
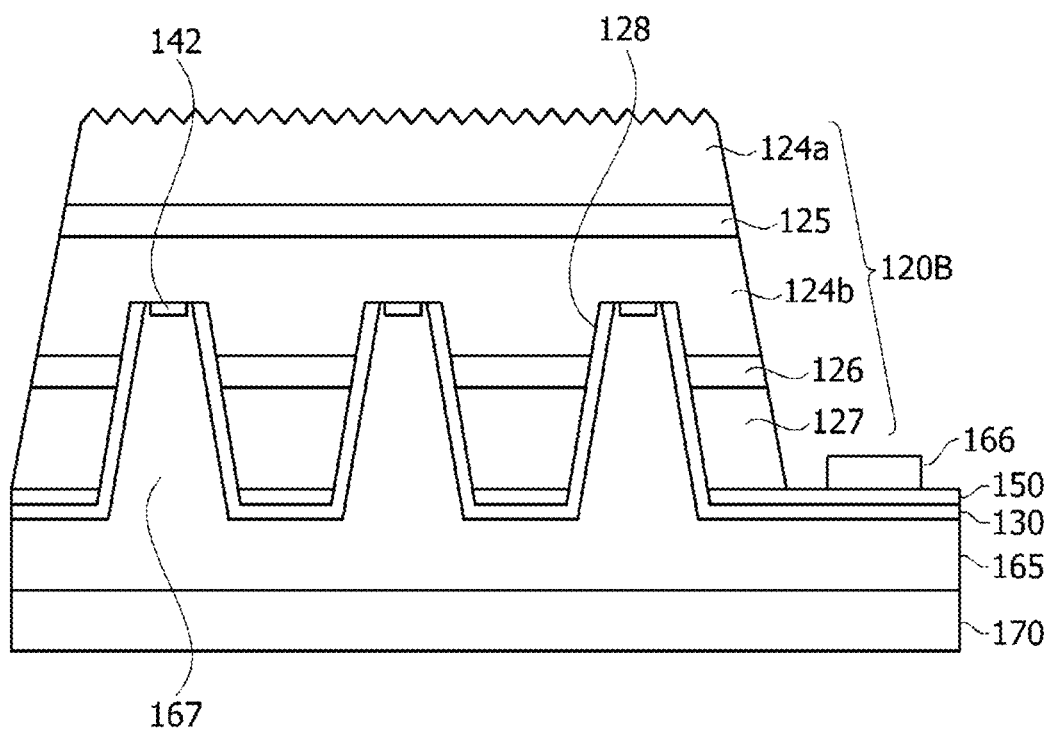
FIG. 12 is a diagram illustrating a manufactured semiconductor device.

FIG. 7 is a conceptual diagram of a light emitting structure having a light absorbing layer and an intermediate layer formed therein, FIG. 8 is a cross-sectional photograph of the light absorbing layer having a bulk structure, FIG. 9 is a cross-sectional photograph of the light absorption layer having a superlattice structure, FIG. 10 is a diagram for describing a process of separating a substrate, FIG. 11 is a diagram for describing a process of etching a light emitting structure, and FIG. 12 is a diagram illustrating a manufactured semiconductor device.

Referring to FIG. 7, a buffer layer 122, a light absorbing layer 123, a first-first conductivity type semiconductor layer 124a, an intermediate layer 125, a first-second conductivity type semiconductor layer 124b, an active layer 126, and a second conductivity type semiconductor layer 127 may be sequentially formed on a growth substrate 121.

The light absorbing layer 123 includes a first light absorbing layer 123a having a low Al composition and a second light absorbing layer 123b having a high Al composition. A plurality of first light absorbing layers 123a and a plurality of second light absorbing layers 123b may be alternately disposed.

The Al composition of the first light absorbing layer 123a may be lower than that of the first conductivity type semiconductor layer 124. The first light absorbing layer 123a may serve as a separator by absorbing laser light during an LLO process. Thus, the growth substrate may be removed.

A thickness and the Al composition of the first light absorbing layer 123a may be appropriately adjusted to absorb laser light having a wavelength of 246 nm. The Al composition of the first light absorbing layer 123a may be in the range of 20% to 60%, and the thickness thereof may be in the range of 1 nm to 10 nm. For example, the first intermediate layer 125a may be formed of AlGaN, but the present invention is not particularly limited thereto. However, the present invention is not limited thereto, and the Al composition and the thickness may be appropriately adjusted to absorb the laser light.

The Al composition of the second light absorbing layer 123b may be higher than that of the light emitting structure 120A. The second light absorbing layer 123b may increase an Al composition that is lowered by the first light absorbing layer 123a, thereby improving crystallinity of the first conductivity type semiconductor layer 124 grown on the light absorbing layer 123.

For example, the Al composition of the second light absorbing layer 123b may be in the range of 60% to 100%, and a thickness thereof may be in the range of 0.1 nm to 2.0 nm. The second light absorbing layer 123b may be made of AlGaN or AlN.

In order to absorb the laser light having the wavelength of 246 nm, the thickness of the first light absorbing layer 123a may be greater than the thickness of the second light absorbing layer 123b. The thickness of the first light absorbing layer 123a may be in the range of 1 nm to 10 nm, and the thickness of the second light absorbing layer 123b may be in the range of 0.5 nm to 2.0 nm.

A thickness ratio of the first light absorbing layer 123a to the second light absorbing layer 123b may be in the range of 2:1 to 6:1. When the thickness ratio is less than 2:1, the first light absorbing layer 123a becomes thinner and thus it is difficult to sufficiently absorb the laser light, whereas when the thickness ratio is greater than 6:1, the second light absorbing layer 123b becomes too thin such that an overall Al composition of the light absorbing layer becomes lower.

A total thickness of the light absorbing layer 123 may be in the range of 100 nm to 400 nm. When the total thickness is less than 100 nm, the thickness of the first light absorbing layer 123a becomes thinner and thus it is difficult to sufficiently absorb the laser light having the wavelength of 246 nm, whereas when the total thickness is greater than 400 nm, an overall Al composition becomes lower such that the crystallinity is degraded.

According to the present embodiment, crystallinity may be improved by forming the light absorbing layer 123 of a superlattice structure. With such a configuration, the light absorbing layer 123 may serve as a buffer layer for alleviating a lattice mismatch between the growth substrate 121 and the light emitting structure 120. When compared to FIG. 8, it can be seen that crystal defects (black dots) transferred to a surface of the light absorbing layer 123 of FIG. 9 are relatively reduced such that the crystallinity is more excellent.

The intermediate layer 125 may be disposed between the first conductivity type semiconductor layer 124 and the active layer 126 or inside the first conductivity type semiconductor layer 124. The intermediate layer 125 includes a first intermediate layer 125a having an Al composition that is lower than that of the first conductivity type semiconductor layer 124 and includes a second intermediate layer 125b having an Al composition that is higher than that of the first conductivity type semiconductor layer 124.

The Al composition of the first intermediate layer 125a may be lower than that of the first conductivity type semiconductor layer 124. During the LLO process, the first intermediate layer 125a may absorb laser light irradiated onto a semiconductor layer disposed on the light absorbing layer 123 by transmitting the light absorbing layer 123, thereby serving to prevent damage to the active layer 126. Thus, the optical power and the electrical characteristic may be improved. The structure described in FIG. 2 may be directly applied to a configuration of the intermediate layer 125.

Referring to FIG. 10, a removal of the growth substrate 121 may include irradiating a laser light $L_1$ from a growth substrate 121 side to separate the growth substrate 121. The laser light $L_1$ may have a wavelength range which is absorbable by the first light absorbing layer 123a. For example, the laser light may be a KrF laser light in a wavelength range of 248 nm, but the present invention is not particularly limited thereto.

The growth substrate 121 and the second light absorbing layer 123b have a large energy bandgap such that the laser light $L_1$ is not absorbed. However, the first light absorbing layer 123a having a low Al composition may be decomposed by absorbing the laser light $L_1$. Thus, the first light absorbing layer 123a may be separated together with the growth substrate 121.

In this case, when a portion of the laser light is incident into the active layer 126 by passing through the light absorbing layer 123, damage occurs at the light emitting structure 120 such that the optical power may be reduced. Therefore, according to the present embodiment, the intermediate layer 125 may be disposed between the first conductivity type semiconductor layer 124 and the active layer 126 to absorb the laser light transmitting the light absorbing layer 123.

In this case, most of the laser light is absorbed by the light absorbing layer such that there is no energy sufficient to separate the intermediate layer 125. Therefore, the intermediate layer 125 may not be separated even though it absorbs the laser light. Further, the thickness of the light absorbing layer 123 or optical power of the laser light may be adjusted so as to prevent absorption of the laser light and separation of the intermediate layer 125.

Thereafter, a light absorbing layer 123-2 remaining on the first conductivity type semiconductor layer 124a may be removed by leveling.

Referring to FIG. 11, the second conductive layer 150 may be formed on the second conductivity type semiconductor layer 127, and then a plurality of recesses 128 may be formed to pass through a portion of the first conductivity type semiconductor layer 124 of the light emitting structure 120. Then, the insulating layer 130 may be formed on a lateral surface of the recess 128 and on the second conductivity type semiconductor layer 127. Thereafter, the first electrode 142 may be formed in the first conductivity type semiconductor layer 124b exposed by the recess 128.

Referring to FIG. 12, the first conductive layer 165 may be formed below the insulating layer 130. The first conductive layer 165 may be electrically insulated from the second conductive layer 150 by the insulating layer 130.

Then, a conductive substrate 170 is formed below the first conductive layer 165, and the second electrode pad 166 may be formed on the second conductive layer 150 exposed by mesa etching.

The semiconductor device may be configured in a package and may be used for curing a resin, a resist, superoxide dismutase (SOD), or a spin on glass (SOG). Alternatively, the semiconductor device may be used for therapeutic medical care or for sterilizing air purifiers, water purifiers, and the like.

Figure 13:
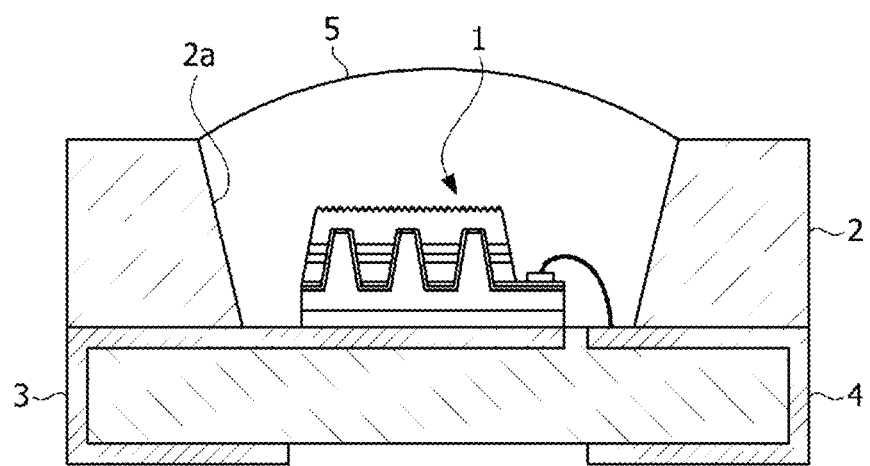
FIG. 13 is a conceptual diagram of a semiconductor device package according to one embodiment of the present invention.

Referring to FIG. 13, a semiconductor device package may include a body 2 having a recess 2a formed therein, a semiconductor device 1 disposed in the body 2, and a pair of lead frames 3 and 4 disposed in the body 2 and electrically connected to the semiconductor device 1.

The body 2 may include a material or a coating layer which reflects UV light. Further, a molding member 5 covering the semiconductor device 1 may include a material which allows UV light to transmit therethrough.

Figure 14:
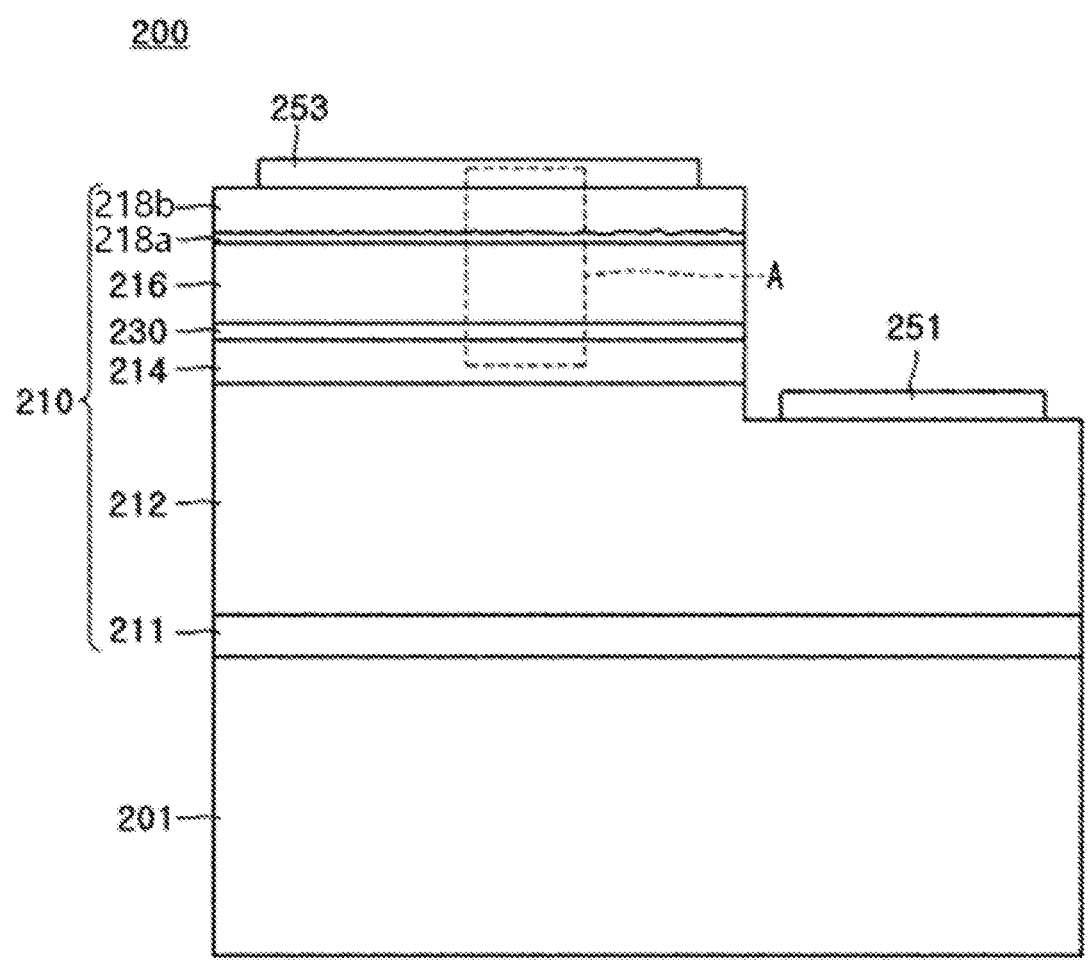
FIG. 14 is a cross-sectional view illustrating a semiconductor device according to an embodiment.
Figure 15:
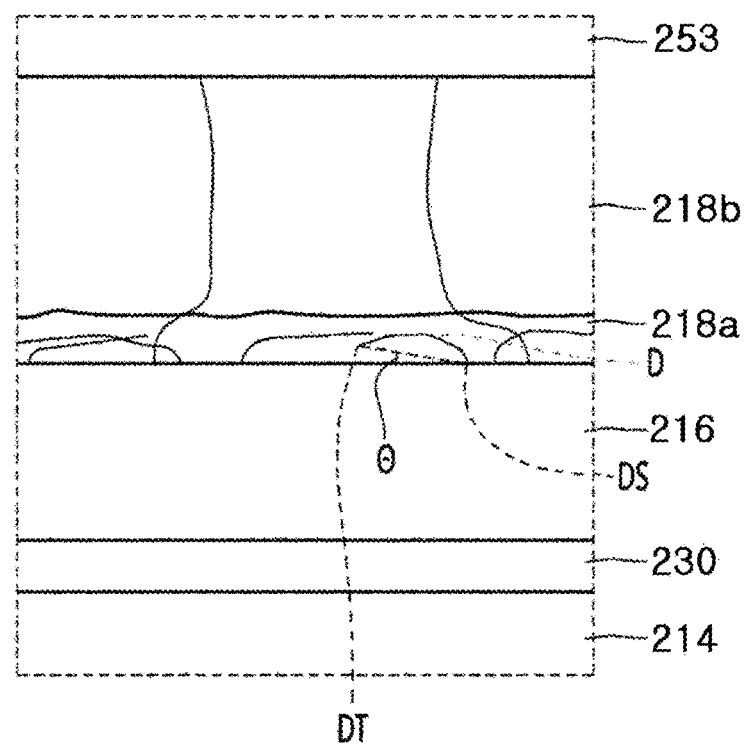
FIG. 15 is a cross-sectional view illustrating Region A of the semiconductor device of FIG. 1.
Figure 16:
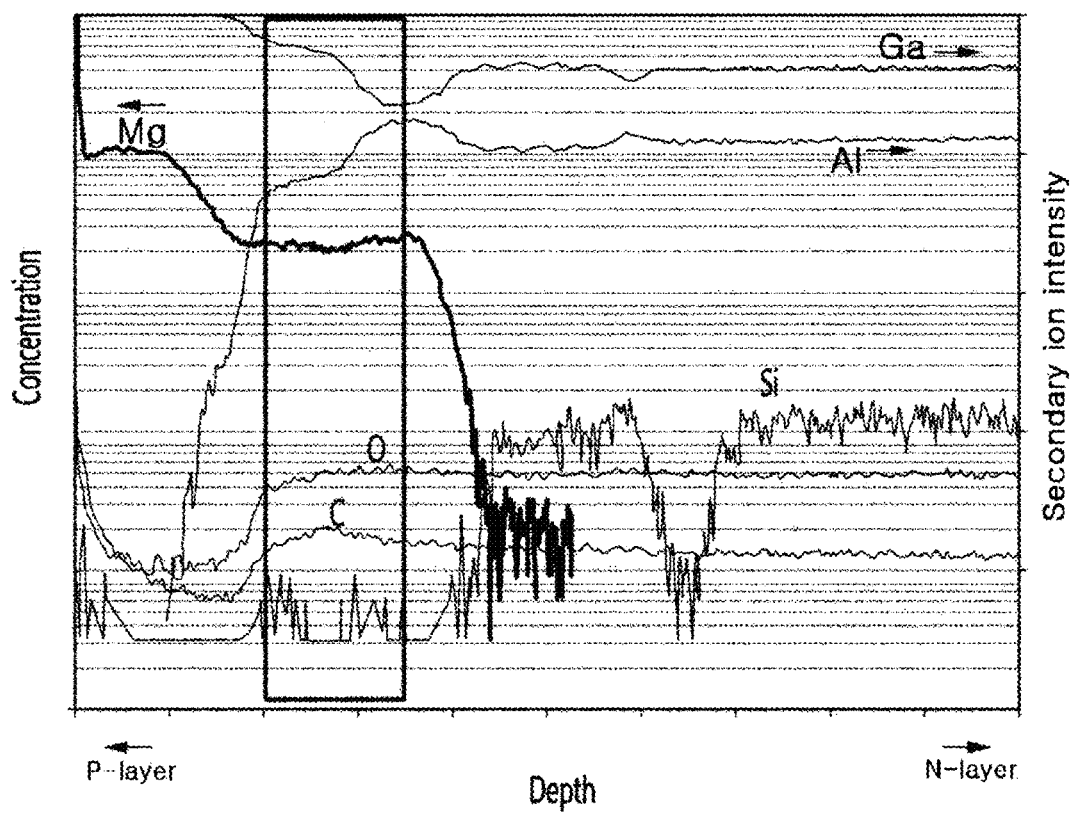
FIG. 16 is a graph showing dopant concentrations of a second-second conductivity type semiconductor layer and a second-third conductivity type semiconductor layer, which are analyzed by secondary-ion mass spectroscopy (SIMS).
Figure 17:
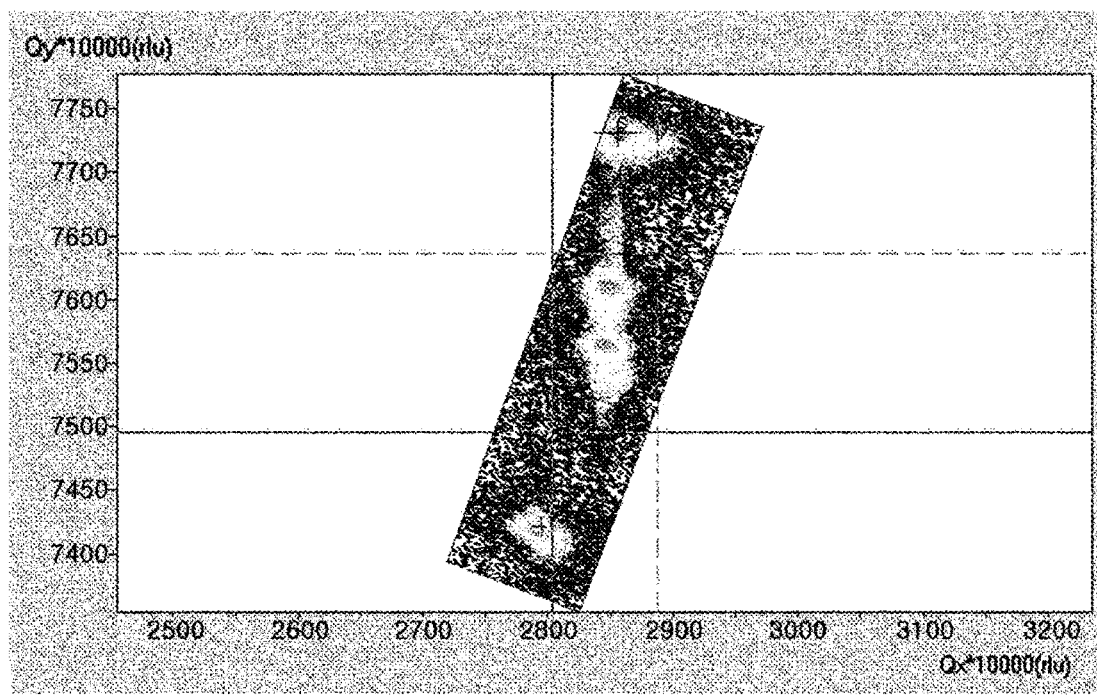
FIGS. 17 and 18 are graphs comparing response surface methodology (RSM) data of a Comparative Example and Example.
Figure 18:
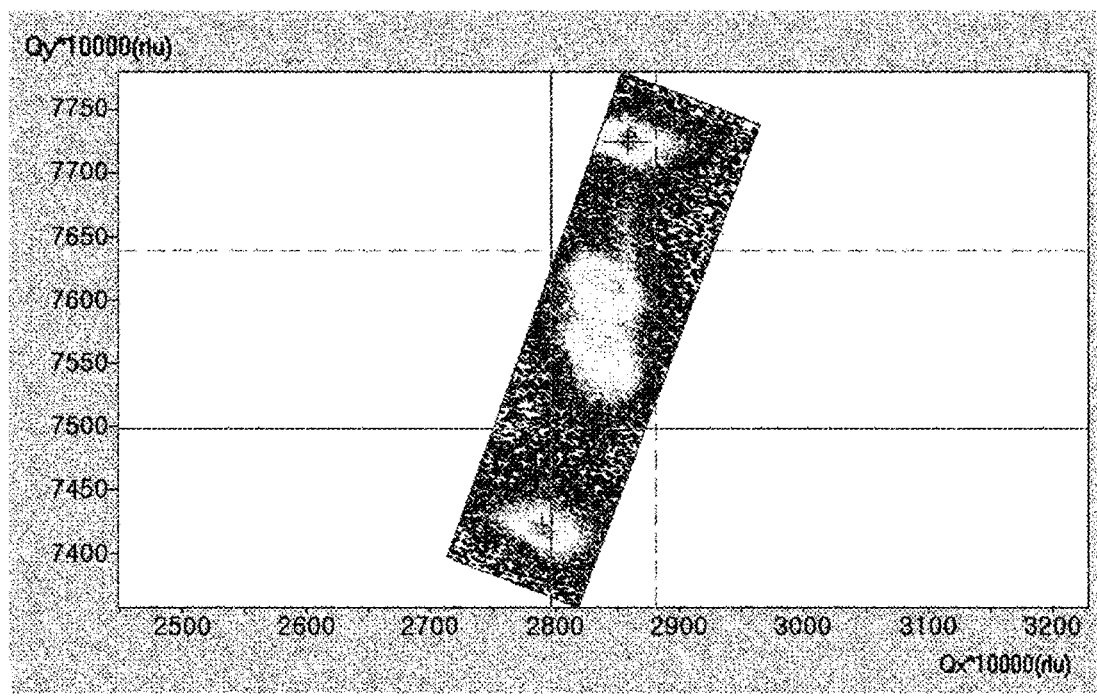

FIG. 14 is a cross-sectional view illustrating a semiconductor device according to an embodiment, FIG. 15 is a cross-sectional view illustrating Region A of the semiconductor device of FIG. 14, FIG. 16 is a graph showing dopant concentrations of a second-second conductivity type semiconductor layer and a second-third conductivity type semiconductor layer, which are analyzed by secondary-ion mass spectroscopy (SIMS), and FIGS. 17 and 18 are graphs comparing response surface methodology (RSM) data of Comparative Example and Example.

As shown in FIGS. 14 and 15, the semiconductor device of the present embodiment may improve crystallinity by improving dislocation of a semiconductor layer. The semiconductor device of the present embodiment improves dislocation due to a difference in lattice constant between the semiconductor layers to entirely uniformly maintain a dopant concentration, thereby improving light emission efficiency. To this end, the semiconductor device of the present embodiment may include a light emitting structure 210 for improving dislocation.

An example of a UV light emitting device 200 according to the present embodiment will be described, wherein a UV light has a wavelength in the range of 200 nm to 400 nm.

The light emitting device 200 may include a substrate 201, the light emitting structure 210, and first and second electrodes 251 and 253.

The light emitting structure 210 includes an AlN template 211, a first conductivity type semiconductor layer 212, an active layer 214, an electron blocking layer (EBL) 230, a second-first conductivity type semiconductor layer 216a, a second-second conductivity type semiconductor layer 218a, and a second-third conductivity type semiconductor layer 218b. In this case, the second-first conductivity type semiconductor layer may be called a second conductivity type first semiconductor layer, the second-second conductivity type semiconductor layer may be called a second conductivity type second semiconductor layer, and the second-third conductivity type semiconductor layer may be called a second conductivity type third semiconductor layer.

The substrate 201 may be formed of a material having high thermal conductivity and may be a conductive substrate or an insulating substrate. For example, the substrate 201 may be formed of at least one among sapphire ($Al_2O_3$), SiC, Si, GaAs, GaN, ZnO, GaP, InP, Ge, and $Ga_2O_3$. An irregularity structure may be formed on the substrate 201, but the present invention is not limited thereto.

The AlN template 211 may be formed on the substrate 201. The AlN template 211 may include a function of buffering. The AlN template 211 may alleviate a lattice mismatch between the substrate 201 and a material of the light emitting structure 210 formed on the AlN template 211, and the AlN template 211 may be formed of a Group III-V or II-VI compound semiconductor, e.g., GaN, InN, InGaN, AlGaN, InAlGaN, and AlInN in addition to AlN.

The AlN template 211 may be grown on the substrate 201 to solve defects due to a difference in lattice constant between subsequently grown AlGaN-based semiconductor layers. The AlN template 211 may have a fully-strained epitaxial structure such that light emission efficiency may be improved during growth of a semiconductor layer of a UV wavelength. That is, the AlN template 211 may improve the crystallinity of the subsequently grown AlGaN-based semiconductor layers, thereby improving light emission efficiency of the UV light emitting device 200.

The first conductivity type semiconductor layer 212 may be formed of a semiconductor compound, e.g., a Group III-V or II-VI compound semiconductor. The first conductivity type semiconductor layer 212 may be formed with a single layer or a multilayer. The first conductivity type semiconductor layer 212 may be doped with a first conductive dopant. For example, when the first conductivity type semiconductor layer 212 is an n-type semiconductor layer, the first conductivity type semiconductor layer 212 may include an n-type dopant. For example, the n-type type dopant may include Si, Ge, Sn, Se, or Te, but the present invention is not limited thereto.

The first conductivity type semiconductor layer 212 of the present embodiment may include a semiconductor material having a composition formula of $Al_xGa_{1-x}N$ (0<x<1), but the present invention is not limited thereto. For example, the first conductivity type semiconductor layer 212 may be formed of one or more among AlGaP, InGaP, AlInGaP, InP, GaN, InN, InGaN, AlGaN, InAlGaN, AlInN, AlGaAs, InGaAs, AlInGaAs, and GaP.

The active layer 214 may be disposed on the first conductivity type semiconductor layer 212. The active layer 214 may be formed of at least one of a single quantum well structure, an MQW structure, a quantum-wire structure, and a quantum dot structure. The active layer 214 is a layer in which electrons (or holes) injected through the first conductivity type semiconductor layer 212 and holes (or electrons) injected through the second-first conductivity type semiconductor layer 216a meet to emit light due to a difference in band gap between energy bands of materials forming the active layer 214.

The active layer 214 may be made of a compound semiconductor. For example, the active layer 214 may be implemented with at least one of a Group III-V or II-VI compound semiconductor. The active layer 214 may include a quantum well and a quantum wall. When the active layer 214 is implemented with an MQW structure, quantum wells and quantum walls may be alternately disposed. Each of the quantum well and the quantum wall may be formed of one or more pair structures among AlGaN/GaN, AlGaN/AlGaN, InGaN/GaN, InGaN/InGaN, InAlGaN/GaN, GaAs/AlGaAs, InGaAs/AlGaAs, GaP/AlGaP, InGaP, and AlGaP, but the present invention is not limited thereto.

The EBL 230 may be disposed on the active layer 214. The EBL 230 according to the present embodiment may have a single layer structure or a multi-layered structure. The EBL 230 may be implemented with at least one of a Group III-V or II-VI compound semiconductor, but the present invention is not limited thereto. The EBL 230 may be doped with a second conductivity type dopant. For example, when the EBL 230 is a p-type semiconductor layer, the second conductivity type dopant may include Mg, Zn, Ca, Sr, or Ba as a p-type dopant.

The second conductivity type semiconductor layers 216, 218a, and 218b may include the second-first conductivity type semiconductor layer 216, a second-first conductivity type semiconductor layer 218a, and a second-first conductivity type semiconductor layer 218b.

The second-first conductivity type semiconductor layer 216 may be disposed on the EBL 230. The second-first conductivity type semiconductor layer 216 may be implemented with a Group III-V or II-VI compound semiconductor. For example, the second-first conductivity type semiconductor layer 216 may be formed of one or more among GaN, InN, AlN, InGaN, AlGaN, InAlGaN, AlInN, AlGaAs, InGaAs, AlInGaAs, GaP, AlGaP, InGaP, AlInGaP, and InP. The second-first conductivity type semiconductor layer 216 of the present embodiment may include an AlGaN-based semiconductor material. The second-first conductivity type semiconductor layer 216 may be doped with a second conductivity type dopant. When the second-first conductivity type semiconductor layer 216 is a p-type semiconductor layer, the second conductivity type dopant may include Mg, Zn, Ca, Sr, or Ba as a p-type dopant.

The second-second conductivity type semiconductor layer 218a may be disposed on the second-first conductivity type semiconductor layer 216. The second-second conductivity type semiconductor layer 218a may include a function of bending dislocation D from the second-first conductivity type semiconductor layer 216. To this end, the second-second conductivity type semiconductor layer 218a may be grown three-dimensionally. The second-second conductivity type semiconductor layer 218a may have a function of buffering the subsequently grown second-third conductivity type semiconductor layer 218b. The second-second conductivity type semiconductor layer 218a may solve defects by bending the dislocation D from the second-first conductivity type semiconductor layer 216, thereby solving back diffusion of the second conductivity type dopant from the EBL 230 to the active layer 214. Referring to FIG. 16, a second conductivity type dopant Mg of the second-first conductivity type semiconductor layer 216 according to the present embodiment may be uniformly doped. That is, according to the present embodiment, a stable doping of the second-first conductivity type semiconductor layer 216 may be implemented.

In the bending of the dislocation D, an angle θ between a straight line connecting a start point DS to a termination point DT of the dislocation D from the second-first conductivity type semiconductor layer 216 and an upper surface of the second-first conductivity type semiconductor layer 216 may be 45 degrees or less. Here, when the angle θ between the straight line and the upper surface of the second-second conductivity type semiconductor layer 218a exceeds 45Ω, the dislocation D may propagate from the second-second conductivity type semiconductor layer 218a to the second-third conductivity type semiconductor layer 218b.

The second-second conductivity type semiconductor layer 218a may be formed of GaN including the second conductivity type dopant, but the present invention is not limited thereto. The second-second conductivity type semiconductor layer 218a may be three-dimensionally grown to bend the dislocation D from the second-first conductivity type semiconductor layer 216. That is, the second-second conductivity type semiconductor layer 218a may improve propagation of the dislocation D toward the second-third conductivity type semiconductor layer 218b by bending the dislocation D from the second-first conductivity type semiconductor layer 216 from a C-plane direction to an A-plane direction and reducing TDD at an interface with the second-third conductivity type semiconductor layer 218b.

In particular, referring to FIGS. 17 and 18, FIG. 17 illustrates RSM data of Comparative Example in which the second-second conductivity type semiconductor layer 218a is omitted, and FIG. 18 illustrates RSM data of Example including the second-second conductivity type semiconductor layer 218a. Here, the RSM data is a strain relaxation parameter, and in Comparative Example, the RSM data represents a second-first conductivity type semiconductor layer of AlGaN and P—GaN of a second-dimensional (2D) mode, and in Example, the RSM data represents the second-first conductivity type semiconductor layer 216 of AlGaN and the second-second conductivity type semiconductor layer 218a of a three-dimensional (3D) P—GaN.

Here, an x-axis is inversely proportional to a difference in A-plane lattice constant (a difference in 2/A-plane lattice constant), and a Y-axis is inversely proportional to a difference in C-plane lattice constant (a difference in 2/C-plane lattice constant).

When compared with Comparative Example, Example may reduce a parallel mismatch between the second-first conductivity type semiconductor layer 216 of AlGaN and the second-second conductivity type semiconductor layer 218a of P—GaN of the 3D mode by 10% or more in an x-axis direction. The parallel mismatch is a strain relaxation parameter representing the extent to which a strain is maintained when the second-first conductivity type semiconductor layer 216 and the second-second conductivity type semiconductor layer 218a of P—GaN of the 3D mode are grown, and the parallel mismatch may solve the dislocation D and the defects. Here, a variation of the strain may be minimized as a variation amount in the x-axis is small, and the minimization of the variation amount may be defined as that the strain is maintained or is not released. The maintaining of the strain may reduce the difference in A-plane lattice constant between the second-first conductivity type semiconductor layer 216 of AlGaN and the second-second conductivity type semiconductor layer 218a of P—GaN of the 3D mode.

The thickness of the second-second conductivity type semiconductor layer 218a may be in the range of 10 nm to 50 nm. When the thickness of the second-second conductivity type semiconductor layer 218a is less than 10 nm, it may be difficult to bend the dislocation D from the second-first conductivity type semiconductor layer 216 and the dislocation D may propagate to the second-third conductivity type semiconductor layer 218b. Here, the dislocation D propagating to the second-third conductivity type semiconductor layer 218b may cause V-pits or cracks. The V-pits or cracks may cause a leakage current. When the thickness of the second-second conductivity type semiconductor layer 218a exceeds 50 nm, defects may occur from an interior of the second-second conductivity type semiconductor layer 218a which is grown three-dimensionally in an island shape.

Roughness (root mean square (RMS)) of an interface between the second-second conductivity type semiconductor layer 218a and the second-third conductivity type semiconductor layer 218b may be 1.0 nm or more, e.g., in the range of 1.0 nm to 5.0 nm. The second-second conductivity type semiconductor layer 218a of the present embodiment may be three-dimensionally grown in an island shape to include the roughness (RMS), which is 1.0 nm or more, of the interface between the second-second conductivity type semiconductor layer 218a and the second-third conductivity type semiconductor layer 218b.

A doping concentration of the second-second conductivity type semiconductor layer 218a may correspond to a doping concentration of each of the second-first conductivity type semiconductor layer 216 and the EBL 230. For example, the doping concentration of the second-second conductivity type semiconductor layer 218a may be in the range of 1E19 to 5E19. The second-second conductivity type semiconductor layer 218a may have a doping concentration that is lower than a doping concentration of the second-third conductivity type semiconductor layer 218b. The doping concentration of the second-third conductivity type semiconductor layer 218b may be higher than the doping concentration of each of the second-second conductivity type semiconductor layer 218a, the second-first conductivity type semiconductor layer 216, and the EBL 230. For example, the doping concentration of the second-third conductivity type semiconductor layer 218b may be in the range of 5E19 to 1E20. The second-third conductivity type semiconductor layer 218b may have a doping concentration that is higher than that of each of the second-second conductivity type semiconductor layer 218a, the second-first conductivity type semiconductor layer 216, and the EBL 230, thereby implementing an ohmic contact with the second electrode 253.

Figure 19:
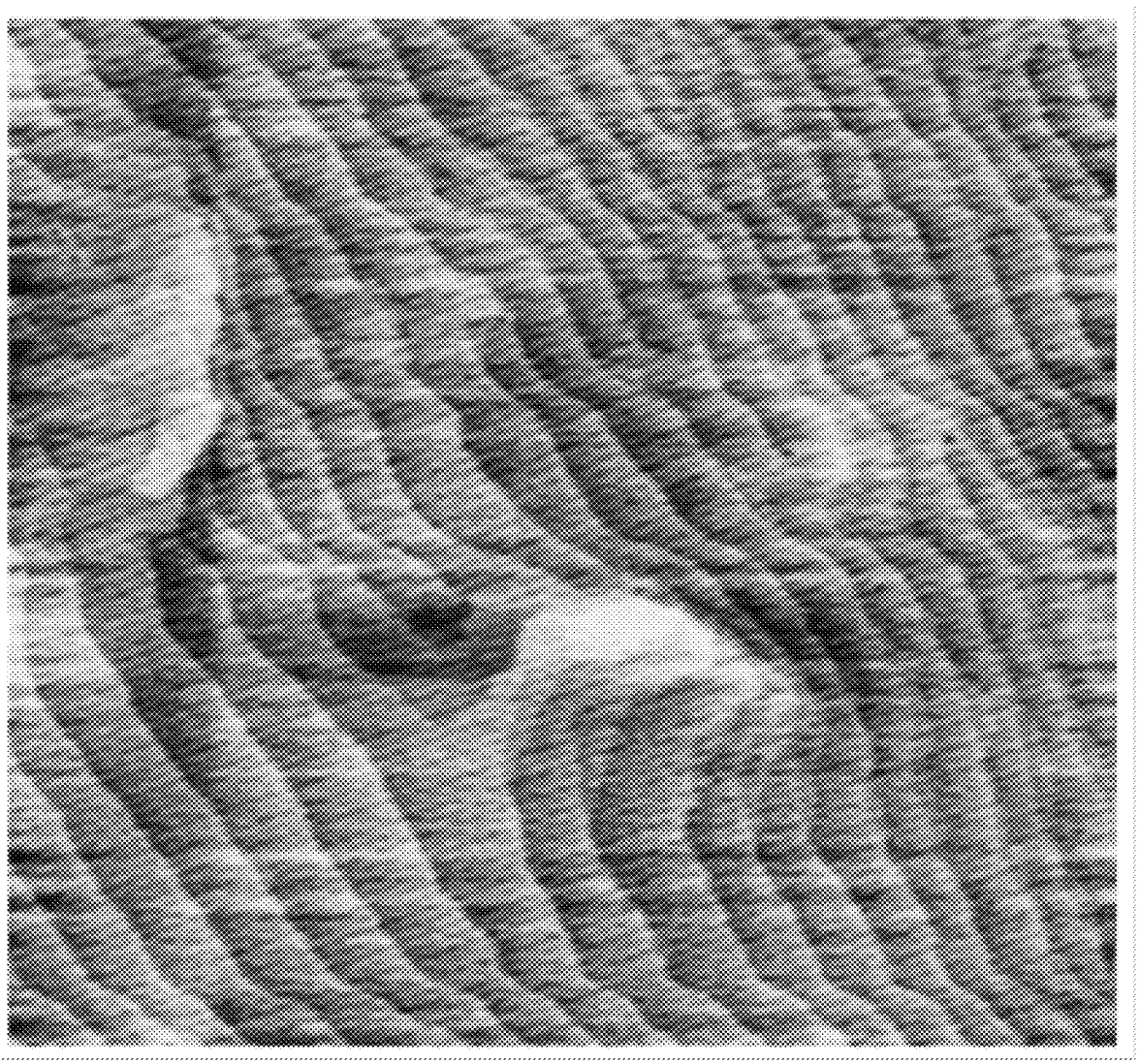
FIG. 19 is a photograph showing a surface of the second-third conductivity type semiconductor layer according to an embodiment.

The second-third conductivity type semiconductor layer 218b may be disposed on the second-second conductivity type semiconductor layer 218a. For an ohmic contact with the second-first conductivity type semiconductor layer 216 and the second electrode 253, the second-third conductivity type semiconductor layer 218b may be made of GaN including the second conductivity type dopant, but the present invention is not limited thereto. The second-third conductivity type semiconductor layer 218b may have a flat surface which is in direct contact with the second electrode 253. To this end, the second-third conductivity type semiconductor layer 218b may be formed by a 3D mode growth method. FIG. 19 is a photograph showing a surface of the second-third conductivity type semiconductor layer 218b according to an embodiment. The second-third conductivity type semiconductor layer 218b of the present embodiment may have a thickness in the range of 100 nm to 300 nm.

When the thickness of the second-third conductivity type semiconductor layer 218b is less than 100 nm, it may be difficult for the second-third conductivity type semiconductor layer 218b to be in ohmic contact with the second electrode 253, whereas when the thickness of the second-third conductivity type semiconductor layer 218b exceeds 300 nm, new defects may occur inside second-third conductivity type semiconductor layer 218b.

The second-third conductivity type semiconductor layer 218b may have a surface roughness (RMS) of 1 nm or less, e.g., in the range of 0.1 nm to 1.0 nm. The second-second conductivity type semiconductor layer 216b of the present embodiment may have the surface roughness (RMS) of 1 nm or less to improve contact reliability with the subsequently formed second electrode 253. The configurations of the above-described embodiments of FIGS. 1 and 2 may be directly applied to configurations of the second-first to second-third conductivity type semiconductor layers.

Here, the first conductivity type semiconductor layer 212 is an n-type semiconductor layer, and the second-first conductivity type semiconductor layer 216, the second-second conductivity type semiconductor layer 218a, and the second-third conductivity type semiconductor layer 218b have been described as being p-type semiconductor layers, but the present invention is not limited thereto. The light emitting structure 210 may be implemented with any one structure among an n-p junction structure, a p-n junction structure, an n-p-n junction structure, and a p-n-p junction structure.

The first electrode 251 may be disposed on the first conductivity type semiconductor layer 212. The first electrode 251 may be electrically connected to the first conductivity type semiconductor layer 212. The first electrode 251 may be electrically insulated from the second electrode 253. The first electrode 251 may be made of a conductive oxide, a conductive nitride, or a metal. For example, the first electrode 251 may include at least one material among an ITO, an ITON, an IZO, an IZON, an AZO, an AGZO, an IZTO, an IAZO, an IGZO, an IGTO, an ATO, a GZO, an IZON, ZnO, $IrO_x$, $RuO_x$, NiO, Au, Cu, Ni, Ti, Ti—W, Cr, W, Pt, V, Fe, and Mo and may be formed as a single layer or a multilayer.

The second electrode 253 may be disposed on the second-third conductivity type semiconductor layer 218b. The second electrode 253 may be in ohmic contact with the second-third conductivity type semiconductor layer 218b. The second electrode 253 may be made of a conductive oxide, a conductive nitride, or a metal. For example, the second electrode 253 may include at least one material among an ITO, an ITON, an IZO, an IZON, an AZO, an AGZO, an IZTO, an IAZO, an IGZO, an IGTO, an ATO, a GZO, an IZON, ZnO, $IrO_x$, $RuO_x$, NiO, Au, Cu, Ni, Ti, Ti—W, Cr, W, Pt, V, Fe, and Mo and may be formed as a single layer or a multilayer.

According to the present embodiment, the dislocation D from the second-first conductivity type semiconductor layer 216 is bent by the three-dimensionally grown second-second conductivity type semiconductor layer 218a such that the defects may be resolved. That is, according to the present embodiment, the second-second conductivity type semiconductor layer 218a prevents propagation of the dislocation D to the subsequently grown second-third conductivity type semiconductor layer 218b such that TDD may be reduced at the interface between the second-second conductivity type semiconductor layer 218a and the second-third conductivity type semiconductor layer 218b.

According to the present embodiment, the second-second conductivity type semiconductor layer 218a, which is grown in a 3D mode, is disposed on the second-first conductivity type semiconductor layer 216 to bend the dislocation D from the second-first conductivity type semiconductor layer 216 such that crystallinity may be improved.

According to the present embodiment, the propagation of the dislocation D is solved to reduce TDD of a final semiconductor layer such that light emission efficiency may be improved.

According to the present embodiment, the doping concentration of the second conductivity type dopant of each of the second-first conductivity type semiconductor layer 216 and the EBL 230 is maintained to be constant such that the back diffusion of the p-dopant from the EBL to the active layer is solved to improve extraction efficiency of the light.

According to the present embodiment, the dislocation D or defects are solved such that degradation of the electrical characteristic due to a leakage current may be improved.

According to the present embodiment, the dislocation D or defects are solved such that TE polarization of the UV light emitting device may be fully implemented.

FIGS. 20 to 23 are cross-sectional views illustrating a method of manufacturing a semiconductor device according to an embodiment.

Figure 20:
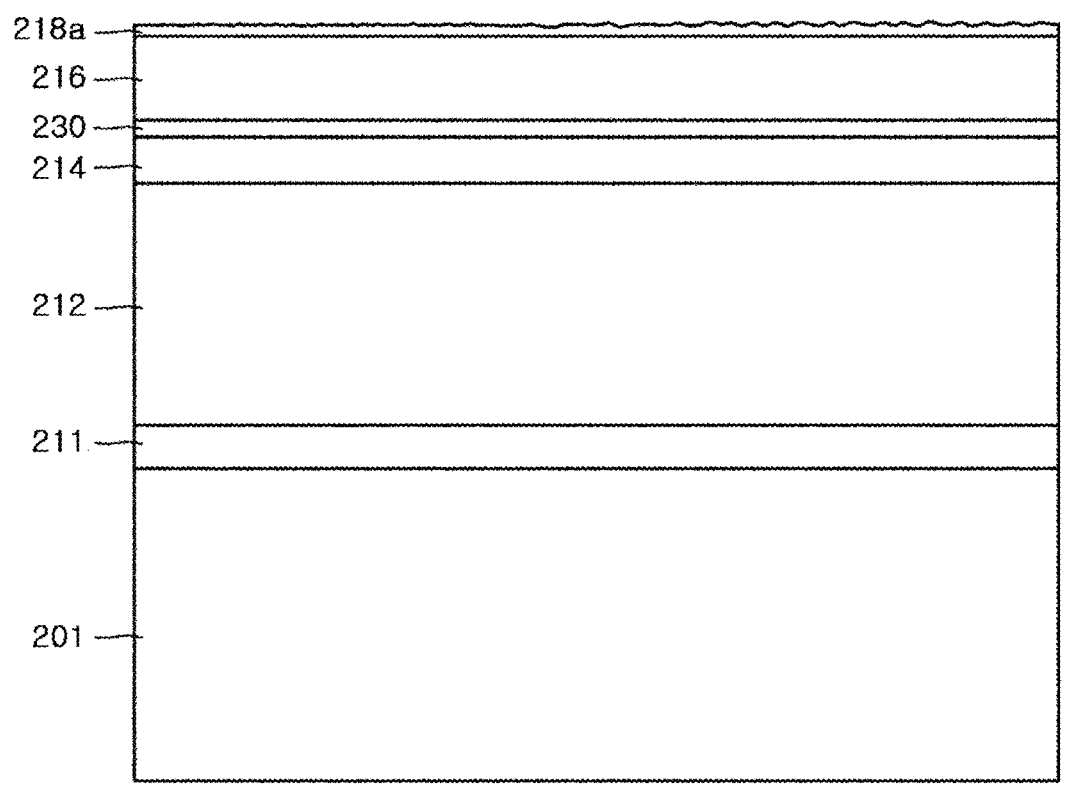
FIGS. 20 to 23 are cross-sectional views illustrating a method of manufacturing a semiconductor device according to an embodiment.
Figure 21:
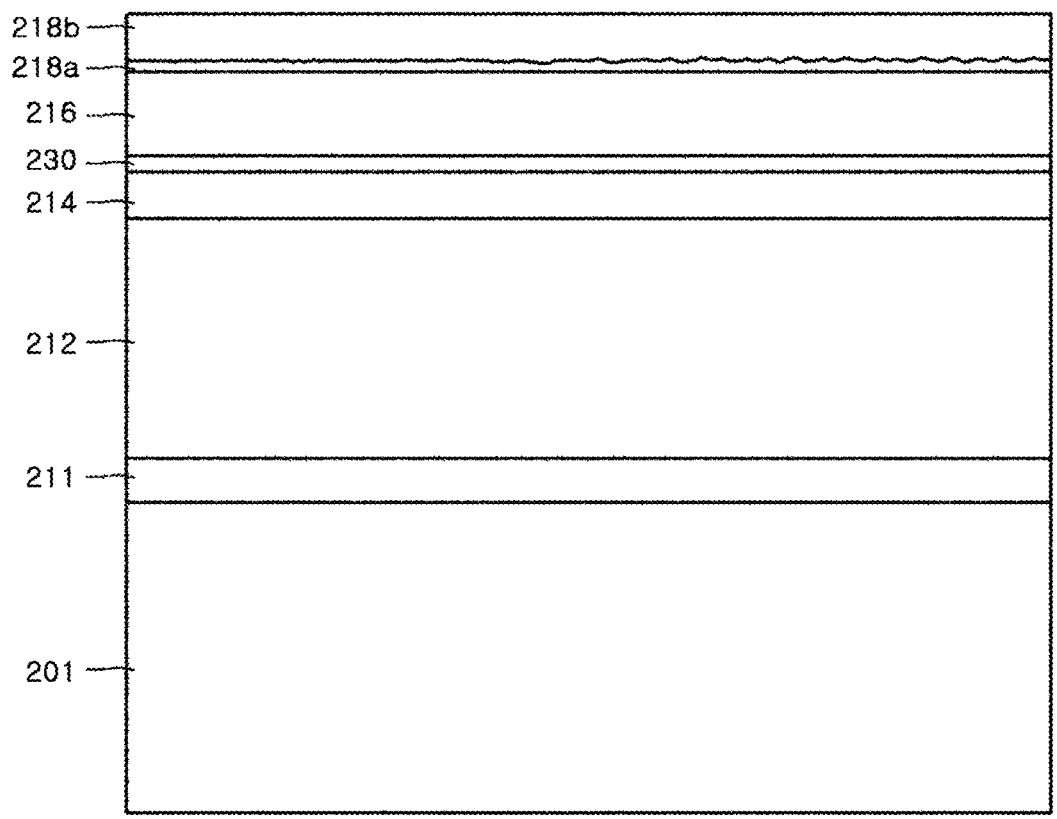

Referring to FIGS. 20 and 21, the method of manufacturing a semiconductor device according to the present embodiment may include forming an AlN template 211, a first conductivity type semiconductor layer 212, an active layer 214, an EBL 230, a second-first conductivity type semiconductor layer 216, a second-second conductivity type semiconductor layer 218a, and a second-third conductivity type semiconductor layer 218b on a substrate 201.

Materials of the substrate 201, the AlN template 211, the first conductivity type semiconductor layer 212, the active layer 214, the EBL 230, and the second-first conductivity type semiconductor layer 216 and a connection relationship therebetween may employ the technical features of FIGS. 14 and 15.

The AlN template 211, the first conductivity type semiconductor layer 212, the active layer 214, the EBL 230, the second-first conductivity type semiconductor layer 216, and the second-second conductivity type semiconductor layer 218a may be formed by metal organic chemical vapor deposition (MOCVD), chemical vapor deposition (CVD), plasma enhanced CVD (PECVD), molecular beam epitaxy (MBE), hydride vapor phase epitaxy (HVPE), or the like, but the present invention is not limited thereto.

The second-second conductivity type semiconductor layer 218a may be formed on the second-first conductivity type semiconductor layer 216. The second-second conductivity type semiconductor layer 218a may include a function of bending dislocation from the second-first conductivity type semiconductor layer 216. To this end, the second-second conductivity type semiconductor layer 218a may be grown three-dimensionally. The second-second conductivity type semiconductor layer 218a may have a function of buffering the subsequently grown second-third conductivity type semiconductor layer 218b. The second-second conductivity type semiconductor layer 218a may solve defects by bending the dislocation from the second-first conductivity type semiconductor layer 216, thereby solving back diffusion of the second conductivity type dopant from the EBL 230 to the active layer 214. According to the present embodiment, a stable doping of the second-first conductivity type semiconductor layer 216 may be implemented.

The second-second conductivity type semiconductor layer 218a may be formed of GaN including the second conductivity type dopant, but the present invention is not limited thereto. The second-second conductivity type semiconductor layer 218a may be three-dimensionally grown to bend the dislocation from the second-first conductivity type semiconductor layer 216. That is, the second-second conductivity type semiconductor layer 218a may improve propagation of the dislocation toward the second-third conductivity type semiconductor layer 218b by bending the dislocation from the second-first conductivity type semiconductor layer 216 from a C-plane direction to an A-plane direction and reduce TDD at an interface with the second-third conductivity type semiconductor layer 218b.

The thickness of the second-second conductivity type semiconductor layer 218a may be in the range of 10 nm to 50 nm. When the thickness of the second-second conductivity type semiconductor layer 218a is less than 10 nm, it may be difficult to bend the dislocation from the second-first conductivity type semiconductor layer 216 and the dislocation may propagate to the second-third conductivity type semiconductor layer 218b. Here, the dislocation propagating to the second-third conductivity type semiconductor layer 218b may cause V-pits or cracks. The V-pits or cracks may cause a leakage current. When the thickness of the second-second conductivity type semiconductor layer 218a exceeds 50 nm, defects may occur from an interior of the second-second conductivity type semiconductor layer 218a which is grown three-dimensionally in an island shape.

Roughness (RMS) of an interface between the second-second conductivity type semiconductor layer 218a and the second-third conductivity type semiconductor layer 218b may be 1.0 nm or more, e.g., in the range of 1.0 nm to 5.0 nm. The second-second conductivity type semiconductor layer 218a of the embodiment may be grown three-dimensionally in an island shape to include the interface roughness (RMS) between the second-second conductivity type semiconductor layer 218a and the second-third conductivity type semiconductor layer 218b of greater than 1.0 nm.

A doping concentration of the second-second conductivity type semiconductor layer 218a may correspond to a doping concentration of each of the second-first conductivity type semiconductor layer 216 and the EBL 230. For example, the doping concentration of the second-second conductivity type semiconductor layer 218a may be in the range of 1E19 to 5E19. The second-second conductivity type semiconductor layer 218a may have a doping concentration that is lower than a doping concentration of the second-third conductivity type semiconductor layer 218b. The doping concentration of the second-third conductivity type semiconductor layer 218b may be higher than the doping concentration of each of the second-second conductivity type semiconductor layer 218a, the second-first conductivity type semiconductor layer 216, and the EBL 230. For example, the doping concentration of the second-third conductivity type semiconductor layer 218b may be in the range of 5E19 to 1E20. The second-third conductivity type semiconductor layer 218b may have a doping concentration that is higher than that of each of the second-second conductivity type semiconductor layer 218a, the second-first conductivity type semiconductor layer 216, and the EBL 230, thereby implementing an ohmic contact with the second electrode 253.

The second-third conductivity type semiconductor layer 218b may be disposed on the second-second conductivity type semiconductor layer 218a. For an ohmic contact with the second-first conductivity type semiconductor layer 216 and the second electrode 253, the second-third conductivity type semiconductor layer 218b may be made of GaN including the second conductivity type dopant, but the present invention is not limited thereto. The second-third conductivity type semiconductor layer 218b may have a flat surface which is in direct contact with the second electrode 253. To this end, the second-third conductivity type semiconductor layer 218b may be formed by a 2D growth method. FIG. 19 is a photograph showing a surface of the second-third conductivity type semiconductor layer 218b according to an embodiment. The second-third conductivity type semiconductor layer 218b of the present embodiment may have a thickness in the range of 100 nm to 300 nm.

When the thickness of the second-third conductivity type semiconductor layer 218b is less than 100 nm, it may be difficult for the second-third conductivity type semiconductor layer 218b to be in ohmic contact with the second electrode 253, whereas when the thickness of the second-third conductivity type semiconductor layer 218b exceeds 300 nm, new defects may occur inside second-third conductivity type semiconductor layer 218b.

The second-third conductivity type semiconductor layer 218b may have a surface roughness (RMS) of 1 nm or less, e.g., in the range of 0.1 nm to 1.0 nm. The second-second conductivity type semiconductor layer 216b of the present embodiment may have the surface roughness (RMS) of 1 nm or less to improve contact reliability with the subsequently formed second electrode 253.

Here, the first conductivity type semiconductor layer 212 is an n-type semiconductor layer, and the second-first conductivity type semiconductor layer 216, the second-second conductivity type semiconductor layer 218a, and the second-third conductivity type semiconductor layer 218b have been described as being p-type semiconductor layers, but the present invention is not limited thereto. The light emitting structure 210 may be implemented with any one structure among an n-p junction structure, a p-n junction structure, an n-p-n junction structure, and a p-n-p junction structure.

Figure 22:
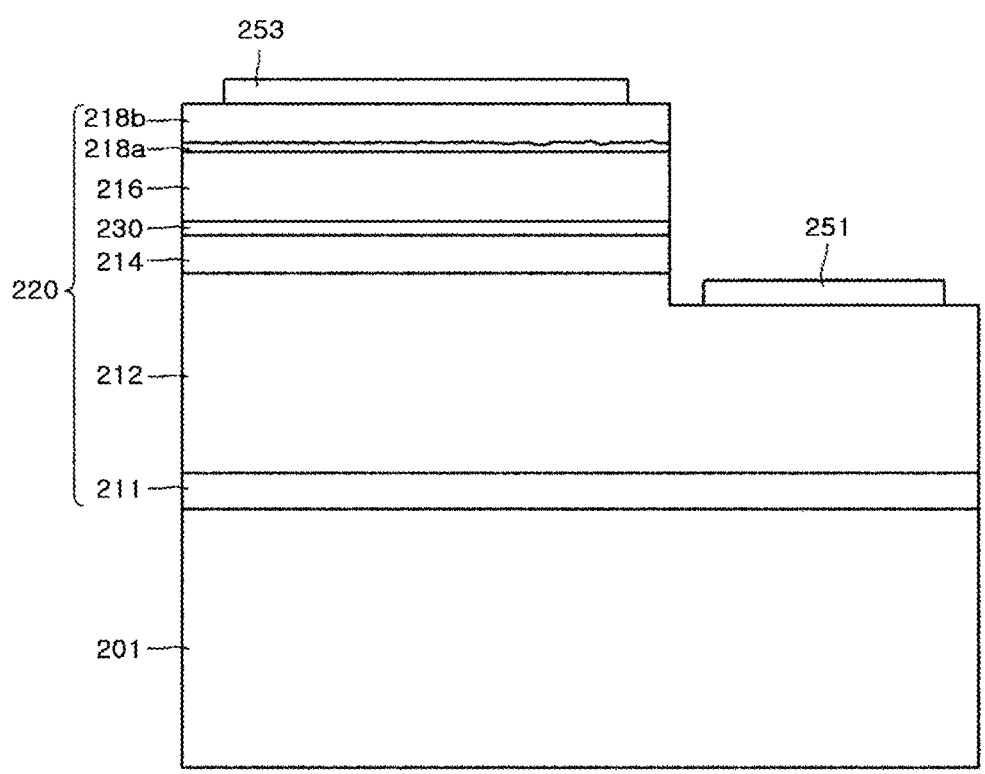

Referring to FIG. 22, the first and second electrodes 251 and 253 may be formed on the light emitting structure 210. In the light emitting structure 210, a portion of the first conductivity type semiconductor layer 212 may be exposed from the active layer 214, the EBL 230, the second-first conductivity type semiconductor layer 216, the second-second conductivity type semiconductor layer 218a, and the second-third conductivity type semiconductor layer 218b by mesa etching.

The first electrode 251 may be formed on the exposed first conductivity type semiconductor layer 212. The first electrode 251 may be electrically connected to the first conductivity type semiconductor layer 212. The first electrode 251 may be electrically insulated from the second electrode 253.

The second electrode 253 may be formed on the second-first conductivity type semiconductor layer 216. The second electrode 253 may be electrically connected to the second-first conductivity type semiconductor layer 216.

Each of the first and second electrodes 251 and 253 may be a conductive oxide, a conductive nitride, or a metal. For example, each of the first and second electrodes 251 and 253 may include at least one material among an ITO, an ITON, an IZO, an IZON, an AZO, an AGZO, an IZTO, an IAZO, an IGZO, an IGTO, an ATO, a GZO, an IZON, ZnO, $IrO_x$, $RuO_x$, NiO, Au, Cu, Ni, Ti, Ti—W, Cr, W, Pt, V, Fe, and Mo and may be formed as a single layer or a multilayer.

Figure 23:
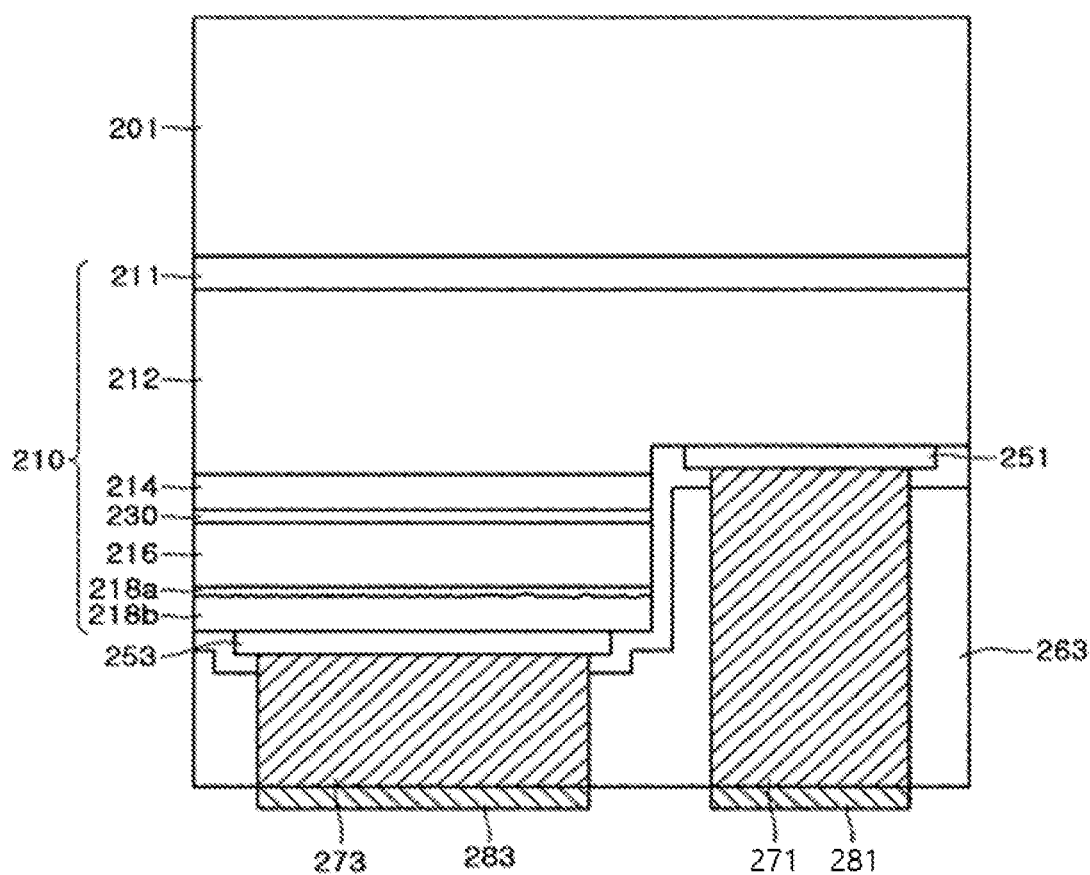

Referring to FIG. 23, a structure according to the present embodiment may be a flip chip structure in which first and second electrodes 251 and 253 are disposed at a lower portion. A first insulating layer 261 may expose a portion of a lower surface of each of the first and second electrodes 251 and 253 and may be formed on the light emitting structure 210. The first insulating layer 261 may be in contact with a lower portion of the light emitting structure 210 at which the first and second electrodes 251 and 253 are disposed.

First and second connection electrodes 271 and 273 may be respectively formed on the lower surfaces of the first and second electrodes 251 and 253 exposed from first insulating layer 261. The first and second connection electrodes 271 and 273 may be formed by a plating process, but the present invention is not limited thereto. The first insulating layer 261 may be an oxide or a nitride. For example, the first insulating layer 261 may be formed of at least one selected from the group consisting of $SiO_2$, $Si_xO_y$, $Si_3N_4$, $Si_xN_y$, $SiO_xN_y$, $Al_2O_3$, $TiO_2$, AN, and the like.

Each of the first and second connection electrodes 271 and 273 may be formed of a metal or an alloy including at least one among Ag, Ni, Al, Rh, Pd, Ir, Ru, Mg, Zn, Pt, Cu, Au, and Hf. The first and second connection electrodes 271 and 273 are made as a single layer or a multilayer formed of a metal, an alloy, or a transparent conductive material such as an ITO, an IZO, an IZTO, an IAZO, an IGZO, an IGTO, an AZO, an ATO, or the like.

A second insulating layer 263 may be formed below the first insulating layer 261 and may be in direct contact with the first insulating layer 261. The second insulating layer 263 may expose lower portions of the first and second connection electrodes 271 and 273 and may be formed on lateral parts of the first and second connection electrodes 271 and 273. The second insulating layer 263 may be formed by adding a thermal diffusion agent in a resin material such as silicone or epoxy. The thermal diffusion agent may include at least one material, e.g., a ceramic material, among an oxide, a nitride, fluoride, and sulfide containing Al, Cr, Si, Ti, Zn, or Zr. The thermal diffusion agent may be defined as a powder particle, a grain, a filler, or an additive having a predetermined size. The second insulating layer 263 may be omitted.

First and second pads 281 and 283 may be formed on the first and second connection electrodes 271 and 273 exposed from the second insulating layer 263. Each of the first and second pads 281 and 283 may be formed of a metal or an alloy including at least one among Ag, Ni, Al, Rh, Pd, Ir, Ru, Mg, Zn, Pt, Cu, Au, and Hf. The first and second pads 281 and 283 are made as a single layer or a multilayer formed of a metal, an alloy, or a transparent conductivity type material such as an ITO, an IZO, an IZTO, an IAZO, an IGZO, an IGTO, an AZO, an ATO, or the like.

The present embodiment includes the substrate 201 disposed above the first conductivity type semiconductor layer 212, but the present is not limited thereto. For example, the substrate 201 may be removed by an LLO process. Here, the LLO process is a process of irradiating laser light onto a lower surface of the substrate 201 to delaminate the substrate 201 from the light emitting structure 210.

According to the present embodiment, the second-second conductivity type semiconductor layer 218a, which is grown in a 3D mode, is disposed on the second-first conductivity type semiconductor layer 216 to bend the dislocation from the second-first conductivity type semiconductor layer 216 such that crystallinity may be improved.

According to the present embodiment, the propagation of the dislocation is solved to reduce TDD of a final semiconductor layer such that light emission efficiency may be improved.

According to the present embodiment, the doping concentration of the second conductivity type dopant of each of the second-first conductivity type semiconductor layer 216 and the EBL 230 is maintained to be constant such that the back diffusion of the p-dopant from the EBL to the active layer is solved to improve extraction efficiency of the light.

According to the present embodiment, the dislocation or defects are solved such that degradation of the electrical characteristic due to a leakage current may be improved.

According to the present embodiment, the dislocation or defects are solved such that TE polarization of the UV light emitting device may be fully implemented.

Figure 24:
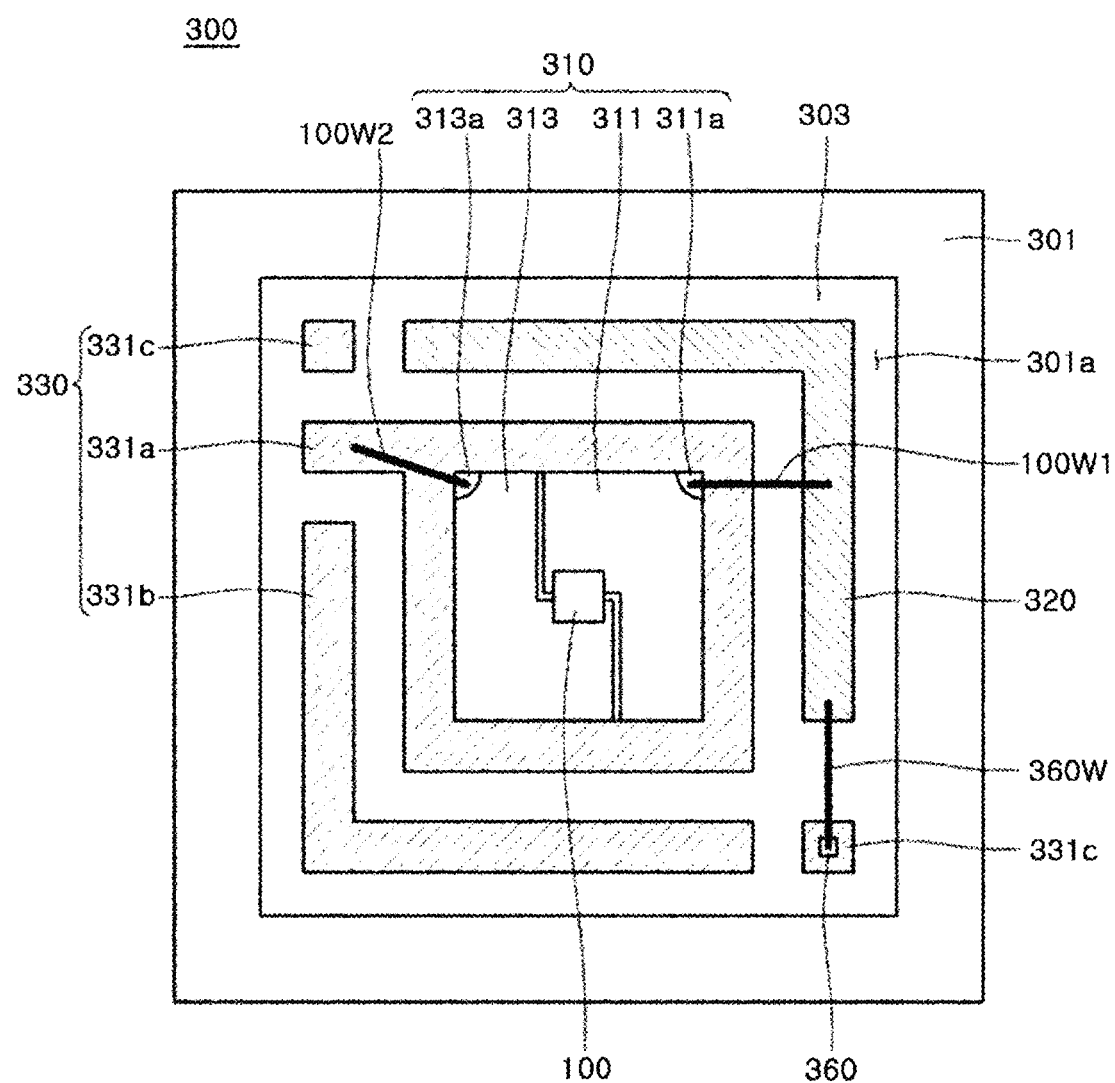
FIG. 24 is a cross-sectional view illustrating a light emitting device package according to an embodiment.

FIG. 24 is a cross-sectional view illustrating a light emitting device package according to an embodiment.

As shown in FIG. 24, a light emitting device package 300 of the present embodiment may include a light emitting device 200, a package body 301, a heat dissipation frame 310, a protection element 360, and first and second lead frames 320 and 330.

The package body 301 may include at least one of a light transmitting material, a reflective material, and an insulating material. The package body 301 may include a material with reflectance higher than transmittance with respect to light emitted from the light emitting device 200. The package body 301 may be formed of a resin-based insulating material. For example, the package body 301 may be formed of at least one among a resin material such as polyphthalamide (PPA) or an epoxy or silicone material, Si, a metal material, a photo sensitive glass (PSG), $Al_2O_3$, and a printed circuit board (PCB). For example, the package body 301 may have a top view shape of a square, but the present is not limited thereto. The top view shape of the package body 301 may have a circular or polygonal shape.

The package body 301 may be coupled to the first and second lead frames 320 and 330. The body 220 may include a cavity 303 for exposing a portion of an upper surface of each of the first and second lead frames 320 and 330. The cavity 303 may expose a portion of the upper surface of the first lead frame 320 and a portion of the upper surface of the second lead frame 330.

The first and second lead frames 320 and 330 may be spaced a predetermined distant apart to be coupled to the package body 301. The light emitting device 200 and the protection element 360 may be disposed at the second lead frame 330, and a first wire 200W1 of the light emitting device 200 and a wire 360W of the protection element 360 may be connected at the first lead frame 320, but the present invention is not limited thereto. The first and second lead frames 320 and 330 may include a conductive material. For example, each of the first and second lead frames 320 and 330 may be made of at least one among Ti, Cu, Ni, Au, Cr, tantalum (Ta), platinum (Pt), Sn, Ag, phosphor (P), iron (Fe), Zn, and Al and may be formed of a plurality of layers. For example, each of the first and second lead frames 320 and 330 of the present embodiment may include a base layer including Cu and an antioxidant layer containing Ag covering the base layer, but the present invention is not limited thereto.

The second lead frame 330 may include a first lead portion 331a exposed to a central region of the cavity 303, a second lead portion 331b configured to correspond to a shape of the first lead frame 320 by being diagonally symmetric with the first lead frame 320, and a third lead portion 331c disposed in a corner region of the cavity 303 in which the protection element 360 is mounted and a diagonal corner region of the cavity 303. A shape of each of the first to third lead portions 331a, 331b, and 331c including an area and a width may be variously modified on an upper surface of the second lead frame 330 exposed at a lower surface of the cavity 303.

The first lead frame 320 may have a bent structure that is diagonally symmetrical to the second lead portion 331b, but the present invention is not limited thereto.

The heat dissipation frame 310 may include first and second heat dissipating electrodes 311 and 313, the first heat dissipating electrode 311 may include a first pad portion 311a connected to a first wire 200W1, and the second heat dissipating electrode 313 may include a second pad portion 313a connected to a second wire 200W2.

The light emitting device 200 may be mounted on the heat dissipation frame 310. Although the present embodiment defines the light emitting device package as including the heat dissipation frame 310, the heat dissipation frame 310 may be omitted. When the heat dissipation frame 310 is omitted, the light emitting device 200 may be disposed on the package body 301. The light emitting device 200 may include the technical features of FIGS. 1 to 23.

The protection element 360 may be disposed on the third lead portion 331c. The protection element 360 may be disposed on the upper surface of the second lead frame 330 exposed from the package body 301. The protection element 360 may be a Zener diode, a thyristor, a transient voltage suppression (TVS), or the like, but the present is not limited thereto. The protection element 360 of the present embodiment will be described as an example of a Zener diode for protecting the light emitting device 200 from an electrostatic discharge (ESD). The protection element 360 may be connected to the first lead frame 310 through the wire.

The light emitting device package of the present embodiment may include the light emitting device 200 which improves a difference in lattice constant between the semiconductor layers, thereby fully implementing TE polarization of the UV light emitting device.

The above-described light emitting device is configured in a light emitting device package and thus may be used as a light source of a lighting system. For example, the light emitting device package may include a body having a cavity and a lead electrode coupled to the body, and the light emitting device may be disposed on the body to be electrically connected to the lead electrode.

For example, the light emitting device may be used as a light source of an image display device or lighting equipment.

When the light emitting device is used as a backlight unit of an image display device, the light emitting device may be used as an edge type backlight unit or a direct-type backlight unit, and, when the light emitting device is used as a light source of a lighting device, the semiconductor device may be used as lighting equipment or bulb type equipment and may also be used as a light source of a mobile terminal.

The light emitting device includes a laser diode in addition to the above-described light emitting diode.

Like the light emitting device, the laser diode may include the first conductivity type semiconductor layer, the active layer, and the second conductivity type semiconductor layer of the above-described structure. Further, the laser diode uses an electro-luminescence phenomenon in which light is emitted when a current flows after a p-type first conductivity type semiconductor and an n-type second conductivity type semiconductor are bonded, but there are differences in directivity and phase of emitted light between the light emitting device and the laser diode. That is, the laser diode may emit light having the same phase in the same direction at a specific single wavelength (i.e., a monochromatic beam) using a phenomenon referred to as stimulated emission and a constructive interference phenomenon, and, with the above-described characteristic, the laser diode may be used for an optical communication, medical equipment, semiconductor processing equipment, and the like.

An example of a light receiving device may include a photodetector which is a kind of transducer that detects light and converts an intensity of the detected light into an electric signal. Such a photodetector may include a photocell (silicon or selenium), a photoconductive element (cadmium sulfide or cadmium selenide), a photodiode (PD) (e.g., a PD having a peak wavelength in a visible blind spectral region or in a true blind spectral region), a phototransistor, a photomultiplier, a photoelectric tube (vacuum or gas filling), an infra-red (IR) detector, or the like, but the present invention is not limited thereto.

Further, a semiconductor device such as the photodetector may be manufactured using a direct bandgap semiconductor which generally has superior photo-conversion efficiency. Alternatively, the photodetector has a variety of structures and includes a pin-type photodetector using a pn junction which is a most general structure, a Schottky photodetector using a Schottky junction, and a metal-semiconductor-metal (MSM) type photodetector.

Like the light emitting device, the PD may include the first conductivity type semiconductor layer, the active layer, and the second conductivity type semiconductor layer of the above-described structure and may be formed of a pn junction or a pin structure. The PD operates by applying a reverse bias or a zero bias, and, when light enters the photodiode, electrons and holes are generated and thus a current flows. At this point, an amount of the current may be approximately proportional to an intensity of the light incident into the PD.

A photovoltaic cell or a solar cell is a kind of a PD that converts light into a current. Like the light emitting device, the solar cell may include the first conductivity type semiconductor layer, the active layer, and the second conductivity type semiconductor layer of the above-described structure.

Further, the solar cell may be used as a rectifier of an electronic circuit through a rectifying characteristic of a general diode using a pn junction and may be applied to an oscillation circuit and the like by being employed to a microwave circuit.

In addition, the above-described semiconductor device is not necessarily implemented with only a semiconductor and may further include a metal material in some cases. For example, the semiconductor device such as a light receiving device may be implemented using at least one among Ag, Al, Au, In, Ga, N, Zn, Se, P, and As or using a semiconductor material, which is doped with a p-type or n-type dopant, or an intrinsic semiconductor material. While the present invention has been mainly described with reference to the exemplary embodiments, it should be understood that the present invention is for illustrative purpose only not limited to the disclosed exemplary embodiments, and various modifications and applications can be devised by those skilled in the art to which the present invention pertains without departing from the gist of the present invention. For example, each component specifically shown in the embodiment can be modified and implemented. It should be construed that differences related to these modifications and applications will fall within the scope of the present invention defined by the appended claims.

The invention claimed is:

1. A semiconductor device comprising:
a conductive substrate;
a light emitting structure disposed on the conductive substrate and including a first conductivity type semiconductor layer, a second conductivity type semiconductor layer, an active layer disposed between the first conductivity type semiconductor layer and the second conductivity type semiconductor layer, and an intermediate layer disposed between the first conductivity type semiconductor layer and the active layer or disposed inside the first conductivity type semiconductor layer; and
a first electrode electrically connected to the first conductivity type semiconductor layer,
wherein the light emitting structure includes a plurality of recesses disposed up to a region of the first conductivity type semiconductor layer by passing through the second conductivity type semiconductor layer and the active layer,
wherein the first electrode is disposed in the plurality of recesses and electrically connected to the intermediate layer,
wherein the first conductivity type semiconductor layer, the intermediate layer, the active layer, and the second conductivity type semiconductor layer include aluminum, and
wherein the intermediate layer includes a first intermediate layer having an aluminum composition that is lower than that of the first conductivity type semiconductor layer and a second intermediate layer having an aluminum composition that is higher than that of the first intermediate layer.

2. The semiconductor device of claim 1, wherein:
a thickness of the first intermediate layer is greater than a thickness of the second intermediate layer.

3. The semiconductor device of claim 1, wherein
a thickness ratio of the first intermediate layer to the second intermediate layer is in a range of 2:1 to 6:1.

4. The semiconductor device of claim 1, wherein
the aluminum composition of the first intermediate layer is in a range of 30% to 60%.

5. The semiconductor device of claim 4, wherein the aluminum composition of the second intermediate layer is in a range of 60% to 100%.

6. The semiconductor device of claim 1, wherein:
the first conductivity type semiconductor layer includes a first-first conductivity type semiconductor layer and a first-second conductivity type semiconductor layer; and
the intermediate layer is disposed between the first-first conductivity type semiconductor layer and the first-second conductivity type semiconductor layer.

7. The semiconductor device of claim 6, wherein
the first-second conductivity type semiconductor layer is disposed to be closer to the active layer than the first-first conductivity type semiconductor layer.

8. The semiconductor device of claim 7, wherein the plurality of recesses is disposed up to a region of the intermediate layer by passing through the first-second conductivity type semiconductor layer.

9. The semiconductor device of claim 8, further comprising a first conductive layer comprising a connection electrode electrically connected to the first conductivity type semiconductor layer.

10. The semiconductor device of claim 7, wherein the aluminum composition of the first-second conductivity type semiconductor layer is lower than that of the first-first conductivity type semiconductor layer.

11. The semiconductor device of claim 7, wherein a thickness of the first-first conductivity type semiconductor layer is greater than a thickness of the first-second conductivity type semiconductor layer.

12. The semiconductor device of claim 1, wherein the intermediate layer is disposed between the first conductivity type semiconductor layer and the active layer.

13. The semiconductor device of claim 1, further comprising a second electrode electrically connected to the second conductivity type semiconductor layer and a conductive layer electrically connected to the second electrode.

14. The semiconductor device of claim 1, wherein the intermediate layer includes a plurality of first intermediate layers and a plurality of second intermediate layers, and
wherein the plurality of first intermediate layers and the plurality of second intermediate layers are alternately stacked.

15. A semiconductor device package comprising:
a body; and
a semiconductor device disposed on the body,
wherein the semiconductor device includes:
a conductive substrate;
a light emitting structure disposed on the conductive substrate and including a first conductivity type semiconductor layer, a second conductivity type semiconductor layer, an active layer disposed between the first conductivity type semiconductor layer and the second conductivity type semiconductor layer, and an intermediate layer disposed between the first conductivity type semiconductor layer and the active layer or disposed inside the first conductivity type semiconductor layer; and
a first electrode electrically connected to the first conductivity type semiconductor layer,
wherein the light emitting structure includes a plurality of recesses disposed up to a region of the first conductivity type semiconductor layer by passing through the second conductivity type semiconductor layer and the active layer,
wherein the first electrode is disposed on the plurality of recesses and electrically connected to the intermediate layer,
wherein the first conductivity type semiconductor layer, the intermediate layer, the active layer, and the second conductivity type semiconductor layer include aluminum, and
wherein the intermediate layer includes a first intermediate layer having an aluminum composition that is lower than that of the first conductivity type semiconductor layer and a second intermediate layer having an aluminum composition that is higher than that of the first intermediate layer.

16. The semiconductor device of claim 1, wherein a total thickness of the intermediate layer is in a range of 50 nm to 1000 nm.

17. The semiconductor device package of claim 15, wherein a thickness ratio of the first intermediate layer to the second intermediate layer is in a range of 2:1 to 6:1.

18. The semiconductor device package of claim 15, wherein a total thickness of the intermediate layer is in a range of 50 nm to 1000 nm.

19. The semiconductor device package of claim 15, wherein the aluminum composition of the first intermediate layer is in a range of 30% to 60%, and
wherein the aluminum composition of the second intermediate layer is in a range of 60% to 100%.

20. The semiconductor device package of claim 15, wherein:
the first conductivity type semiconductor layer includes a first-first conductivity type semiconductor layer and a first-second conductivity type semiconductor layer; and
the intermediate layer is disposed between the first-first conductivity type semiconductor layer and the first-second conductivity type semiconductor layer.

* * * * *